United States Patent
Hyun et al.

(10) Patent No.: US 10,055,294 B2
(45) Date of Patent: Aug. 21, 2018

(54) SELECTIVE COPYBACK FOR ON DIE BUFFERED NON-VOLATILE MEMORY

(71) Applicant: SanDisk Technologies, Inc., Plano, TX (US)

(72) Inventors: Jea Hyun, Los Altos, CA (US); Robert Wood, Niwot, CO (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 589 days.

(21) Appl. No.: 14/593,938

(22) Filed: Jan. 9, 2015

(65) Prior Publication Data

US 2015/0193299 A1 Jul. 9, 2015

Related U.S. Application Data

(60) Provisional application No. 61/925,549, filed on Jan. 9, 2014.

(51) Int. Cl.
| | |
|---|---|
| *G06F 11/10* | (2006.01) |
| *G11C 29/52* | (2006.01) |
| *G11C 16/34* | (2006.01) |
| *G11C 29/02* | (2006.01) |

(52) U.S. Cl.
CPC ........ *G06F 11/108* (2013.01); *G06F 11/1072* (2013.01); *G11C 16/349* (2013.01); *G11C 29/021* (2013.01); *G11C 29/028* (2013.01); *G11C 29/52* (2013.01); *G11C 2211/5641* (2013.01)

(58) Field of Classification Search
CPC .. G06F 11/108; G06F 11/1072; G11C 16/349; G11C 29/021; G11C 29/028; G11C 29/52
See application file for complete search history.

(56) References Cited

U.S. PATENT DOCUMENTS

| | | |
|---|---|---|
| 5,805,789 A | 9/1998 | Huott et al. |
| 7,137,055 B2 | 11/2006 | Hirano et al. |
| 7,573,762 B2 | 8/2009 | Kenkare et al. |
| 8,187,936 B2 | 5/2012 | Alsmeier et al. |
| 8,543,757 B2 | 9/2013 | Gorobets et al. |
| 9,378,097 B1* | 6/2016 | Bellorado ............. G06F 11/076 |
| 2009/0193058 A1 | 7/2009 | Reid |
| 2009/0204752 A1 | 8/2009 | Sasaki |

(Continued)

OTHER PUBLICATIONS

Shimpi, Anand Lal, "Samsung SSD 840 EVO Review: 120GB, 250GB, 500GB, 750GB & 1TB Models Tested", AnandTech, Jul. 25, 2013, pp. 5, www.anandtech.com/show/7173/samsung-ssd-840-evo-review-120gb-250gb-500gb-750gb-1tb-models-tested/4.

(Continued)

*Primary Examiner* — Eric Cardwell
(74) *Attorney, Agent, or Firm* — Kunzler, PC

(57) ABSTRACT

Apparatuses, systems, methods, and computer program products are disclosed for on die buffered non-volatile memory management. A method includes storing data in a first set of non-volatile memory cells. A method includes determining one or more attributes associated with data. A method includes determining whether to store data in a second set of non-volatile memory cells based on one or more attributes. A second set of non-volatile memory cells may be configured to store more bits per cell than a first set of non-volatile memory cells.

29 Claims, 14 Drawing Sheets

(56) References Cited

U.S. PATENT DOCUMENTS

| | | |
|---|---|---|
| 2011/0040932 A1 | 2/2011 | Frost et al. |
| 2011/0252187 A1 | 10/2011 | Segal et al. |
| 2012/0110250 A1* | 5/2012 | Sabbag ............... G06F 11/1072 711/103 |
| 2012/0254574 A1 | 10/2012 | Sinclair et al. |
| 2012/0324277 A1 | 12/2012 | Weston-Lewis et al. |
| 2013/0055047 A1 | 2/2013 | Sharon et al. |
| 2013/0185609 A1 | 7/2013 | Park et al. |
| 2013/0282955 A1 | 10/2013 | Parker et al. |
| 2013/0326125 A1 | 12/2013 | Chang et al. |
| 2013/0336072 A1 | 12/2013 | Wood et al. |
| 2014/0006688 A1 | 1/2014 | Yu et al. |
| 2014/0043903 A1 | 2/2014 | Ok et al. |
| 2015/0193302 A1 | 7/2015 | Hyun |
| 2016/0092129 A1 | 3/2016 | Agarwal et al. |

OTHER PUBLICATIONS

"Using COPYBACK Operations to Maintain Data Integrity in NAND Flash Devices", Micron, Oct. 2008, pp. 4, TN-29-41.
U.S. Appl. No. 14/593,965 Notice of Allowance dated Jul. 7, 2016.
PCT/US2015/010905 International Preliminary Report on Patentability dated Jul. 21, 2016.
Application No. PCT/US2015/010905, International Search Report and Written Opinion, dated Apr. 7, 2015.

\* cited by examiner

Driver
702

Mapping Logic Module
704

Hardware Controller
706

Non-Volatile Memory Media
122

FIG. 7

SELECTIVE COPYBACK FOR ON DIE BUFFERED NON-VOLATILE MEMORY

CROSS-REFERENCES TO RELATED APPLICATIONS

This application claims the benefit of U.S. Provisional Patent Application No. 61/925,549 entitled "ON DIE BUFFERED NON-VOLATILE MEMORY MANAGEMENT" and filed on Jan. 9, 2014 for Jea Hyun et al., the entire contents of which are incorporated herein by reference for all purposes.

TECHNICAL FIELD

The present disclosure, in various embodiments, relates to memory management and more particularly relates to management of on die buffered non-volatile memory.

BACKGROUND

Certain flash memory and other solid-state storage devices implement multi-level cell (MLC) memory media, triple level cell (TLC) memory media, or the like to store multiple bits of data in the same memory cell. In general, MLC and TLC memory cells are programmable to multiple states, which are each characterized by separate voltage thresholds. As an example, a two-bit MLC memory cell can be programmed to one of four different states or a three-bit TLC memory cell can be programmed to one of eight different states, with each state corresponding to a unique voltage range.

If single level cell (SLC) memory media is included in the same device with MLC and/or TLC memory media, the allocation and use of the different types of memory media must be managed. SLC, MLC, and TLC memory media may have different write times, read times, programming requirements, reliability, error rates, or the like. Further, copying data between different types of memory media may introduce errors, amplifying the introduction of errors as data is copied. If power is lost or a device is shutdown while data is being copied from one type of memory media to another, the data may be corrupted or lost. Different data may also have different usage patterns, priorities, or the like which may not be consistent with or optimal for certain types of memory media.

SUMMARY

Methods are presented for on die buffered (ODB) non-volatile memory management. In one embodiment, a method includes storing data in a first set of non-volatile memory cells. A method, in a further embodiment, includes determining one or more attributes associated with data. In certain embodiments, a method includes determining whether to store data in a second set of non-volatile memory cells based on one or more attributes associated with the data. A second set of non-volatile memory cells, in another embodiment, is configured to store more bits per cell than a first set of non-volatile memory cells.

Apparatuses are presented for on die buffered (ODB) non-volatile memory management. In one embodiment, a buffer module is configured to store data in a first set of non-volatile storage cells. In a further embodiment, a copyback module is configured to determine whether to store data in a second set of non-volatile storage cells based on one or more data factors. A second set of non-volatile storage cells, in another embodiment, represents data using more storage states per cell than a first set of non-volatile storage cells.

Systems are presented for on die buffered (ODB) non-volatile memory management. A non-volatile memory element, in certain embodiments, comprises a set of single level cell (SLC) non-volatile memory cells and a set of triple level cell (TLC) non-volatile memory cells. In one embodiment, a controller selectively determines to copy data from a set of SLC non-volatile memory cells to a set of TLC non-volatile memory cells. A controller, in a further embodiment, adjusts one or more read voltage thresholds for a set of SLC non-volatile memory cells based on one or more storage media characteristics for the set of SLC non-volatile memory cells for copying data from the set of SLC non-volatile memory cells to a set of TLC non-volatile memory cells.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which:

FIG. 7 is a schematic block diagram illustrating one embodiment of a system for storing data in a multi-level memory cell;

DETAILED DESCRIPTION

Figure 1:
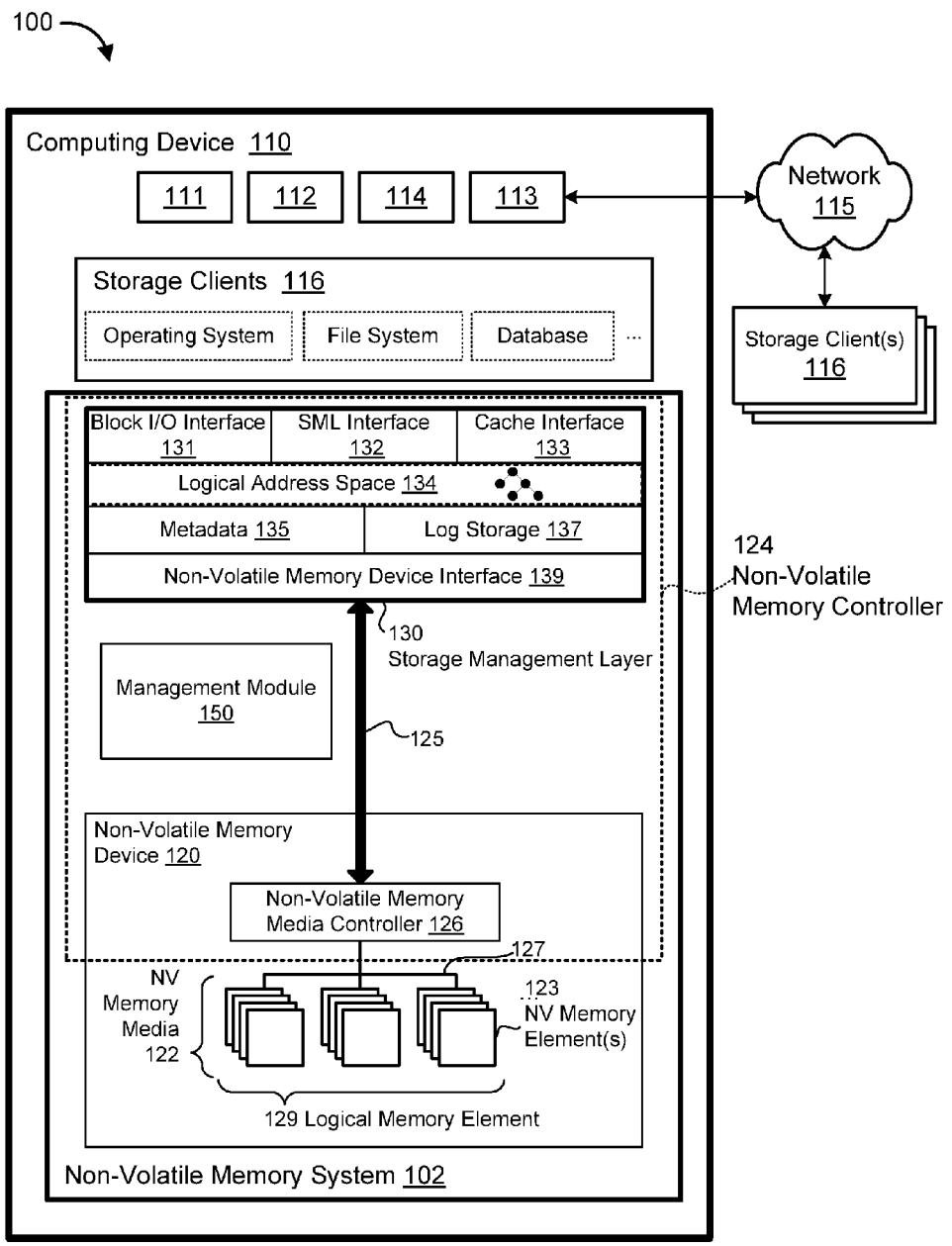
FIG. 1 is a schematic block diagram illustrating one embodiment of a system for on die buffered (ODB) non-volatile memory management.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: pages, memory divisions, erase blocks, sectors, blocks, collections or sets of physical storage locations (e.g., logical pages, logical erase blocks, described below), or the like.

The non-volatile memory controller may comprise a storage management layer (SML), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (each non-volatile memory element being accessible in parallel). As used herein, a logical memory division refers to a set of two or more physical memory divisions, each physical memory division on a respective non-volatile memory element in the respective logical memory element.

The logical address space presented by the storage management layer may have a logical capacity, which may correspond to the number of available logical addresses in the logical address space and the size (or granularity) of the data referenced by the logical addresses. For example, the logical capacity of a logical address space comprising $2^{32}$ unique logical addresses, each referencing 2048 bytes (2 KiB) of data may be $2^{43}$ bytes. (As used herein, a kibibyte (KiB) refers to 1024 bytes). In some embodiments, the logical address space may be thinly provisioned. As used herein, a "thinly provisioned" logical address space refers to a logical address space having a logical capacity that exceeds the physical capacity of the underlying non-volatile memory device(s). For example, the storage management layer may present a 64-bit logical address space to the storage clients (e.g., a logical address space referenced by 64-bit logical addresses), which exceeds the physical capacity of the underlying non-volatile memory devices. The large logical address space may allow storage clients to allocate and/or reference contiguous ranges of logical addresses, while reducing the chance of naming conflicts. The storage management layer may leverage the any-to-any mappings between logical addresses and physical storage resources to manage the logical address space independently of the underlying physical storage devices. For example, the storage management layer may add and/or remove physical storage resources seamlessly, as needed, and without changing the logical addresses used by the storage clients.

The non-volatile memory controller may be configured to store data in a contextual format. As used herein, a contextual format refers to a self-describing data format in which persistent contextual metadata is stored with the data on the physical storage media. The persistent contextual metadata provides context for the data it is stored with. In certain embodiments, the persistent contextual metadata uniquely identifies the data that the persistent contextual metadata is stored with. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data. The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media, a memory division index, or the like).

In some embodiments, the contextual data format may allow data context to be determined (and/or reconstructed) based upon the contents of the non-volatile memory media, and independently of other metadata, such as the arbitrary, any-to-any mappings discussed above. Since the media location of data is independent of the logical address of the data, it may be inefficient (or impossible) to determine the context of data based solely upon the media location or media address of the data. Storing data in a contextual format on the non-volatile memory media may allow data context to be determined without reference to other metadata. For example, the contextual data format may allow the metadata to be reconstructed based only upon the contents of the non-volatile memory media (e.g., reconstruct the any-to-any mappings between logical addresses and media locations).

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (the erasure latency is no longer part of the critical path of a write operation).

The non-volatile memory controller may comprise one or more processes that operate outside of the regular path for servicing of storage operations (the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1 is a block diagram of one embodiment of a system 100 comprising a management module 150. In general, the management module 150 is configured to dynamically and/or intelligently manage copyback and/or internal data move (IDM) operations for the non-volatile memory media 122 to optimize the copying or moving of data between storage cells of different types (e.g., SLC, MLC, TLC) and/or access of the data. In certain embodiments, the management module 150 may be configured to selectively determine whether or not to internally copy or move data, using a copyback operation, IDM operation, or the like, from a first set of non-volatile storage cells (e.g., SLC storage cells) to a second set of non-volatile storage cells (e.g., TLC storage cells) based on one or more attributes of the data (e.g., data factors). The management module 150, in a further embodiment, may be configured to selectively determine whether to refresh data of a copyback or IDM operation (e.g., decode the data to correct one or more errors and re-encode the corrected data), based on one or more attributes of the data (e.g., data factors), or the like. In one embodiment, the management module 150 may be configured to adjust one or more read voltage thresholds for a first set of non-volatile storage cells (e.g., SLC storage cells) in order to reduce errors in the data for copying or moving the data to a second set of non-volatile storage cells (e.g., TLC storage cells).

The management module 150 may be part of and/or in communication with a storage management layer (SML) 130. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The non-volatile memory devices 120 may include different types of non-volatile memory devices including, but not limited to: solid-state storage devices, hard drives, SAN storage resources, or the like. The non-volatile memory devices 120 may comprise one or more respective non-volatile memory media controllers 126 and non-volatile memory media 122. The SML 130 may provide access to the one or more non-volatile memory devices 120 via a traditional block I/O interface 131. Additionally, the SML 130 may provide access to enhanced functionality (large, virtual address space) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on the one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change memory (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise a plurality of cells for storing data. As used herein, a cell refers to the smallest physical unit of storage or memory of the non-volatile memory media 122. In some embodiments, each cell has a physical and/or electrical property which may be altered to encode or otherwise store data. While cells of the non-volatile memory media 122 are generally referred to herein as "memory cells" or "storage cells," the cells may more generally comprise recording cells capable of recording data. Further, while the management module 150 is primarily described herein with regard to the non-volatile memory media 122, in certain embodiments, the management module 150 may operate in a substantially similar manner to manage volatile memory media.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

In certain embodiments, the non-volatile memory media 122 comprises multiple different types of media, such as SLC storage cells, MLC storage cells, TLC storage cells, or the like. For example, each chip, die, die plane, or the like of the non-volatile memory media 122 may comprise one or more erase blocks of SLC storage cells to buffer or otherwise store data for one or more erase blocks of TLC storage cells. In another embodiment, individual word lines and/or pages within an erase block may be configured and/or used as SLC storage cells, MLC storage cells, TLC storage cells, or the like, in various combinations. For example, certain types of 3D NAND flash memory media 122 may comprise erase blocks with word lines or pages that are individually configurable as SLC, MLC, TLC, quad-level-cell (QLC), or the like.

Non-volatile memory media 122 that comprises different levels or types of media may be referred to as "on die buffered" memory media 122, as used herein. In other embodiments, the non-volatile memory media 122 may comprise SLC storage cells to buffer data for MLC storage cells, MLC storage cells to buffer data for TLC storage cells, or another combination of first, source storage cells to buffer data for second, destination storage cells having more storage states and bits per cell than the first, source storage cells. While performing copyback operations from SLC storage cells to TLC storage cells is described herein for purposes of simplicity, the description applies equally to copyback operations from SLC to MLC, from MLC to TLC, from SLC to QLC, from MLC to QLC, from TLC to QLC storage cells and so on for other sets of storage cells in different modes or of different types.

As the number of storage states and bits per cell increases, read times, write/program times, or the like may also increase. Further, in certain embodiments, the more bits of data each storage cell of a set of storage cells is configured to store, the more data may be buffered before the set of storage cells is programmed. Instead of buffering data in volatile memory of the non-volatile memory media controller 126, of the SML 130, of the host computing device 110, or the like, the management module 150 may buffer data in the non-volatile memory media 122. For example, the management module 150 may buffer or store data in three erase blocks of SLC storage cells for storage in a single erase block of TLC storage cells, or the like.

As used herein, a copyback or IDM operation, procedure, or process comprises copying or moving data from a first, source set of storage cells to a second, destination set of storage cells. A copyback or IDM operation may compact the copied data, by copying or moving the data from less dense storage cells to more dense storage cells (e.g., copying data from SLC storage cells to MLC or TLC storage cells). Copyback or IDM may also comprise destaging, in embodiments where data is cached in a first set of storage cells for storage in a second set of storage cells, or the like.

The management module 150 may manage the copying or moving of data between different sets of storage cells (e.g., pages, erase blocks, or the like) using copyback or IDM operations. For example, the non-volatile memory media 122 may support or provide a copyback or IDM command for performing a copyback operation, which the management module 150 may use to internally copy or move data. In other embodiments, the management module 150 may perform a copyback or IDM operation without a copyback or IDM command, using general purpose read and write/program commands or the like. The management module 150, in one embodiment, is configured to dynamically and/or intelligently manage copyback and/or IDM operations for the non-volatile memory media 122 to optimize the copying or moving of data between storage cells of different types (e.g., SLC, MLC, TLC) and/or access of the data.

In certain embodiments, the management module 150 may be configured to selectively determine whether or not to internally copy or move data, using a copyback operation, an IDM operation, or the like, from a first set of non-volatile storage cells (e.g., SLC storage cells) to a second set of non-volatile storage cells (e.g., TLC storage cells) based on one or more data factors. For example, the management module 150 may internally copyback or move lower priority and/or less frequently accessed data from faster, less-dense storage cells, such as SLC storage cells, to slower, more-dense storage cells, such as TLC storage cells, while leaving higher priority and/or more frequently accessed data in the faster, less-dense storage cells, at least temporarily, thereby providing greater performance, reliability, or the like for the higher priority and/or more frequently accessed data.

The management module 150, in a further embodiment, may be configured to selectively determine whether to refresh data of a copyback or IDM operation (e.g., decode the data to correct one or more errors and re-encode the corrected data), based on one or more data factors, or the like. Refreshing data by decoding and re-encoding the data may comprise copying or moving the data from the non-volatile memory element 123 (e.g., a chip, a die, a die plane) to the non-volatile memory media controller 126, the storage management layer 130, and/or another entity for decoding and re-encoding. In embodiments where the management module 150 may copyback or move data without refreshing the data, the data may remain within a single non-volatile memory element 123 (e.g., a chip, a die, a die plane), so that the copyback and/or IDM procedure may complete without the performance penalty of copying or moving the data off of the non-volatile memory element 123 for decoding and re-encoding and copying or moving the re-encoded data back to the non-volatile memory element 123. In this manner, the management module 150 may refresh certain data to reduce or prevent errors while copying or moving other data back without refreshing the data.

In one embodiment, the management module 150 may be configured to adjust one or more read voltage thresholds for a first set of non-volatile storage cells (e.g., SLC storage cells) in order to reduce errors in the data for copying or moving the data to a second set of non-volatile storage cells (e.g., TLC storage cells). Without managing read voltage thresholds for source non-volatile storage cells, the management module 150 may have a limited time in which to perform a copyback and/or IDM operation for data before the data becomes corrupted and errors are introduced. Any errors introduced to data in the source non-volatile storage cells (e.g., SLC storage cells) may be amplified or intensified by copying or moving corrupted data to the destination non-volatile storage cells (e.g., TLC storage cells). By adjusting one or more read voltage thresholds for the source non-volatile storage cells, the management module 150 may reduce or eliminate data errors, with or without refreshing the data, allowing the data to be stored in the source non-volatile storage cells for a longer period of time than if default read voltage thresholds were used.

In one embodiment, the management module 150 may comprise executable software code, such as a device driver for the non-volatile memory device 120, the SML 130, or the like, stored on the computer readable storage media 114 for execution on the processor 111. In another embodiment the management module 150 may comprise logic hardware of the one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the management module 150 may include a combination of both executable software code and logic hardware.

In one embodiment, the management module 150 is configured to receive storage requests from the SML 130 via a bus 125 or the like. The management module 150 may be further configured to transfer data to/from the SML 130 and/or storage clients 116 via the bus 125. Accordingly, the management module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the management module 150 may receive storage requests as an API call from a storage client 116, as an IO-CTL command, or the like. The management module 150 is described in greater detail below with regard to FIGS. 3A and 3B.

A "cell" refers to the smallest physical unit of storage or memory of non-volatile memory media 122. In some embodiments, each cell has a physical and/or electrical property which may be altered to encode or otherwise store data. For example, in Flash memory, a cell may include a floating gate transistor, and the physical property used to encode data may be the charge stored on the floating gate, the threshold voltage Vt that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. As described above with regard to the non-volatile memory media 122, many types of cells may encode data of a non-volatile memory device 120 for use with the management module 150.

In one embodiment, the range of possible values for the data-encoding physical property of a cell is divided into discrete program states or abodes, so that each program state or abode encodes one or more possible data values. In some embodiments, the program states or abodes are configured to encode values for a plurality of bits. For example, if a cell stores a single bit using two states (e.g., in SLC mode), a first state may encode a binary one, "1" and a second state may encode a binary zero, "0." If a cell stores two bits using four states (e.g., in MLC mode), each state may encode a different value for the two bits of the cell, such as "11," "01," "00," or "10." If a cell stores three bits using eight states (e.g., in TLC mode), each state may encode a different value for the three bits of the cell, such as "111," "011," "001," "101," "100," "000," "010," or "110." In a further embodiment, the states or abodes of a cell may be separated by guard bands or separation distances. As used herein, a program "state" or "abode" refers to a sub-range of possible values for the data-encoding physical property of a cell, so that each state corresponds to a single set of one or more data values. An abode, program state, programming state, or storage state, may comprise a range of read levels, such as a read voltage level for flash media, a read resistivity level for PCM media, or the like, associated with a particular set of one or more data values. Read thresholds, such as a read voltage threshold, a read resistivity threshold, or the like, may separate abodes or program states. States/abodes and guard bands are described in further detail below with regard to FIG. 9A.

In some embodiments, an encoding maps states or abodes of a cell to data values. In general, an encoding is a mapping that allows each state or abode of a cell to represent a corresponding data value or set of data values. For example, in a cell with two states (e.g., SLC), the encoding may map the lower state to a binary "1" and the upper state to a binary "0," so that the cell stores one bit of information. As another example, in a cell with four states (e.g., MLC), a Gray code encoding or the like may map the four states L0, L1, L2, and L3 to the data values "11," "01," "00," and "10," respectively, so that the cell stores two bits of information. Similarly, in a cell with eight states (e.g., TLC), a Gray code encoding or the like may map the eight states L0, L1, L2, L3, L4, L5, L6, and L7 to the data values "111," "011," "001," "101," "100," "000," "010," and "110" so that the cell stores, includes, and/or encodes three bits of information. The non-volatile memory media 122 may store data using other encodings. Encodings are described in further detail below with regard to FIG. 9B.

As described below, a multi-level or MLC memory cell stores at least two bits, a most significant bit (MSB) and a least significant bit (LSB). One type of MLC memory media is triple level cell (TLC) memory media that stores or encodes three bits, a MSB, a central significant bit (CSB), and a LSB. Other embodiments of MLC memory media may store or encode more than three bits per cell, such as a quad level cell with sixteen abodes or program states per cell that encode four bits, or the like. In certain embodiments, a MSB, CSB, and/or LSB, though part of the same physical memory cell, may be assigned to different pages of the non-volatile memory media 122 (e.g., an upper, middle, and/or lower page).

In certain embodiments, a plurality of the multi-level storage cells are organized on the non-volatile memory media 122 (e.g., NAND flash memory media) as a physical page. In certain non-volatile memory media 122, a physical page is the smallest unit that can be written or programmed to the non-volatile memory media 122. In such embodiments, a memory cell may be associated with a page tuple comprising a page for each bit of the cell (e.g., two pages or a page pair for MLC, three pages for TLC). A page tuple is a set of pages (e.g., upper, middle, and/or lower) that are associated with a single, common set of physical memory cells. For example, a memory cell may be associated with a page pair that includes an upper page and a lower page, a page tuple that includes an upper page, a middle page, and a lower page, or the like. An upper page may be associated with the MSBs, a middle page may be associated with the CSBs, and the lower page may be associated with the LSBs, or the reverse. Physical pages, in certain embodiments, may be grouped or organized into logical pages, with each logical page comprising multiple physical pages.

Thus, the MSB, CSB, and LSB of a memory cell may have different addresses in the non-volatile memory device 120. In certain embodiments, the upper page includes the MSBs of a plurality of memory cells, the middle page includes the CSBs of the plurality of memory cells, and the lower page includes the LSBs of the same, common set or plurality of memory cells. Writes directed to the upper page may therefore cause changes only in the MSBs of the associated memory cells, writes directed to the middle page may cause changes only in the CSBs of the associated memory cells, and writes directed to the lower page may cause changes only in the LSBs of the associated memory cells, based on a data encoding for abodes or program states of the memory cells.

The management module 150, in certain embodiments, writes data and/or causes data to be programmed to a set of memory cells in accordance with a sequential page programming order for the non-volatile memory media 122. For example, a sequential page programming order may indicate that a first/lower page be programmed prior to a second/middle page being programmed, that a second/middle page be programmed prior to a third/upper page being programmed, or another predefined order of page programming for a set of cells. The non-volatile memory media 122 may require a multi-stage programming process, such as a two stage programming process (e.g., lower page then upper page or vice versa), a three stage programming process (e.g., lower page, then middle page, then upper page), or the like. In a further embodiment, certain non-volatile memory media 122 may require that each page or bit of a set of memory cells be known, be present, be ready to be programmed, and/or be programmed at the same time (e.g., that a middle and/or upper page of data be programmed or be ready for programming prior to a lower page being programmed).

In some embodiments, each non-volatile memory cell has $2^X$ possible programming states or abodes, where X is equal to the number of bits per non-volatile memory cell. For example, a MLC non-volatile memory cell may store two bits of information and, accordingly, have four possible programming states or abodes. As another example, a TLC non-volatile memory cell may store three bits of information and, accordingly, have eight possible programming states or abodes.

As described above, even though the MSB, the CSB, and the LSB are part of the same physical triple level memory cell 402, the MSB, the CSB, and the LSB may be assigned to different physical and/or logical pages of the media. In certain embodiments, a plurality of the non-volatile memory cells is logically organized as one or more pages on the non-volatile memory device 120. A page may be used as the designation of the smallest unit that can be written or programmed to the non-volatile memory device 120. Moreover, the non-volatile memory cell may be associated with a page tuple. A page tuple is a set of pages (e.g., designated as lower, middle, and/or upper pages) that are associated with a single, common set of physical non-volatile memory cells. In one example, a two-bit non-volatile memory cell is associated with a page pair, in which the MSB is associated with an upper page and the LSB is associated with a lower page. The specific convention used to correlate the MSB/CSB/LSB with the upper/middle/lower pages in a particular embodiment does not necessarily limit other conventions that may be used in other embodiments. Thus, the MSB, CSB, and LSB in the same non-volatile memory cell may have different logical and/or physical addresses in the non-volatile memory device 120.

Additionally, the write operations may be implemented in one or more stages, and each stage may include one or more incremental voltage level changes (e.g., incremental step pulse programming). For example, changing the state of a non-volatile memory cell from the erase state/L0 to state A/L1 may occur in a single programming phase over multiple incremental voltage level changes, each voltage level change increasing the voltage level of the non-volatile memory cell a fraction of the difference between the erase state/L0 and the A/L1 state. In another example, changing the state of a non-volatile memory cell from the erase state/L0 to the LM state may be performed in a single programming phase over a single voltage level change (with a relatively high programming voltage) or over multiple incremental voltage level changes (each using a relatively low programming voltage).

In some embodiments, one or more read operations may be performed at read voltage thresholds between different abodes or program states to determine in which abode or program state the read voltage falls. For example, for a MLC memory cell, a first read operation may be performed on a non-volatile memory cell to determine whether the read voltage is between the ERASE/L0 state and the A/L1 state, a second read operation may be performed to distinguish between the A/L1 state and the B/L2 state, and a third read operation may be performed to distinguish between the B/L2 state and the C/L3 state. Once a programming state is identified, both the MSB and LSB may be known, because each programming state corresponds to two (or more) bits. In certain embodiments, the data bits are read in response to requests for data stored on the non-volatile memory device 120.

Figure 2:
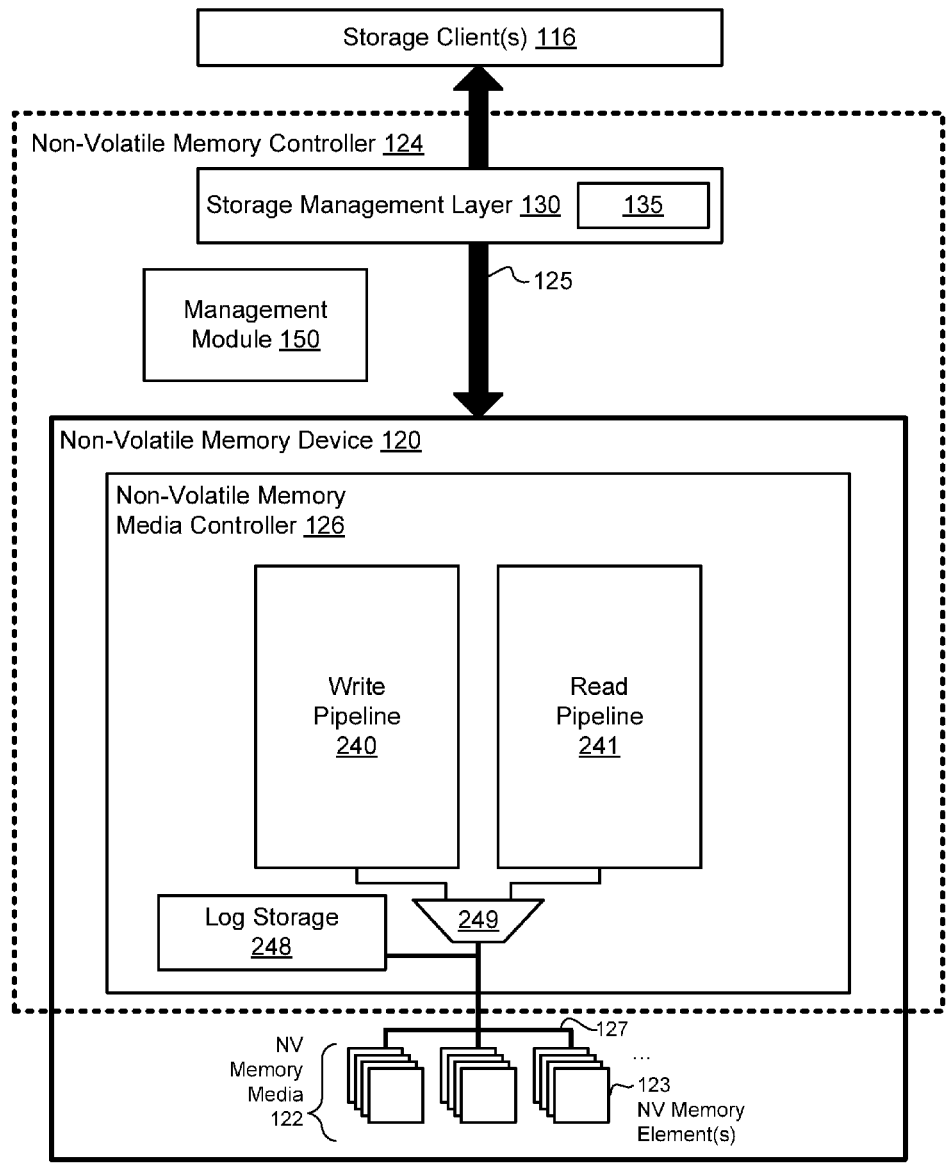
FIG. 2 is a schematic block diagram illustrating an embodiment of a non-volatile memory system.

FIG. 2 depicts one embodiment of a non-volatile memory controller 124 comprising a management module 150. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the management module 150. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header (or other packet field). The write pipeline 240, in certain embodiments, may encode and/or protect the data using an error-correcting code (ECC), such as a block code, a convolutional code, a Bose-Chaudhuri-Hocquenghem (BCH) code, a low-density parity check (LDPC) code, a Hamming code, a Reed-Solomon code, a turbo code, or the like. The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 (and/or bus 127).

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIG. 1). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the management module 150. The requests may comprise a logical address of the requested data, a media address of the requested data, and so on. The read pipeline 241, in certain embodiments, may decode and/or correct one or more data errors for the data using an error-correcting code (ECC), such as a block code, a convolutional code, a Bose-Chaudhuri-Hocquenghem (BCH) code, a low-density parity check (LDPC) code, a Hamming code, a Reed-Solomon code, a turbo code, or the like. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3A:
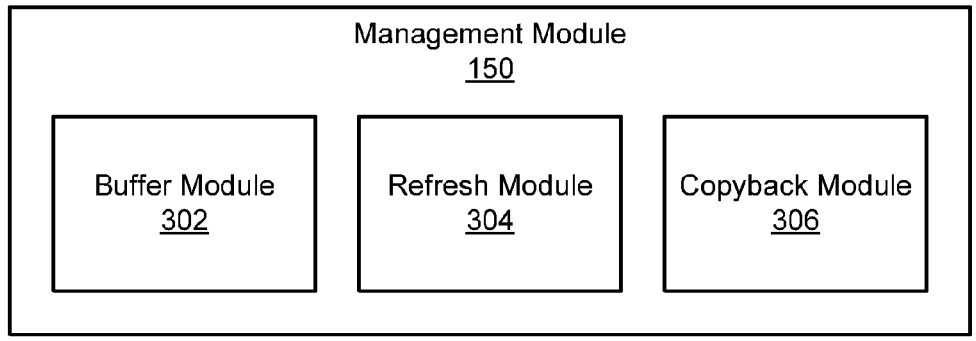
FIG. 3A is a schematic block diagram illustrating one embodiment of a management module.

FIG. 3A depicts one embodiment of a management module 150. The management module 150 may be substantially similar to the management module 150 described above with regard to FIG. 1. In the depicted embodiment, the management module 150 includes a buffer module 302, a refresh module 304, and a copyback module 306.

In one embodiment, the buffer module 302 buffers or otherwise stores data (e.g., user data or other workload data of a write request) in a first set of non-volatile storage cells, such as one or more erase blocks of SLC storage cells. The buffer module 302 may receive data from one or more storage clients 116, associated with one or more write/program requests or the like. The buffer module 302 may temporarily store or stage data in a volatile memory buffer, such as the volatile memory 112 of the host computing device 110, volatile memory of the non-volatile memory device 120, or the like, to facilitate programming of the data to a set of storage cells of the non-volatile memory media 122.

In certain embodiments, the buffer module 302 may store buffered data within the non-volatile memory media 122 of the non-volatile memory device 120 itself, such as in one or more first/source erase blocks configured or partitioned as SLC memory cells, so that the data is persistently stored but so that a sequential programming order does not apply. For example, enough volatile memory may not exist within the non-volatile memory device 120, a hold up time for the non-volatile memory device 120 may not be long enough to program all of the buffered data, or the like and buffering the data in the non-volatile memory media 122 may protect the data from a power failure, so that the data may still be programmed after recovery from the power failure from the one or more first/source erase blocks. For example, to provide greater data throughput, write bandwidth, or the like, the non-volatile memory controller 124, 126 and/or the buffer module 302 may use an interleaved programming order. For TLC memory cells with three pages or bits per cell, the buffer module 302 may instruct the non-volatile memory device 120 to program in an interleaved order, such as a lower page of a first set of memory cells, a lower page of a second set of memory cells, a lower page of a third set of memory cells, a middle page of the first set of memory cells, a middle page of the second set of memory cells, a middle page of the third set of memory cells, an upper page of the first set of memory cells, an upper page of the second set of memory cells, and an upper page of the third set of memory cells, or the like. In such an embodiment, the buffer module 302 may buffer several pages at a time.

In certain embodiments, the non-volatile memory media 122 may require that all three pages of data for a set of memory cells be known before programming any of the pages, or that all three pages be programmed at the same time. If all three pages are not programmed, even the programmed pages may be lost if a restart event occurs. For at least these reasons, in certain embodiments, the buffer module 302 may buffer or store all three pages of data for a set of storage cells. In a further embodiment, to provide interleaving as described above, the buffer module 302 may buffer nine pages, three for each of three different sets of storage cells (e.g., pages or wordlines within an erase block, within one or more different erase blocks, or the like).

The buffer module 302, in various embodiments, may buffer or store data in SLC storage cells for copying to TLC storage cells, in SLC storage cells for copying to MLC storage cells, in MLC storage cells for copying to TLC storage cells, or otherwise buffer or store data in a first set of storage cells for copying to a second set of storage cells with more storage states or bits per cell than the first set of storage cells. For example, the buffer module 302 may buffer or store data in three SLC erase blocks for copying or moving back to a TLC erase block, or the like. The buffer module 302 may receive data for buffering or storing from a read pipeline 241, as described above with regard to FIG. 2, which may packetize the data, encode the data with an error-correcting code (ECC), compress the data, and/or perform other operations on the data.

In one embodiment, the refresh module 304 selectively refreshes data from a first set of non-volatile storage cells (e.g., SLC storage cells) for copying or moving the data back to a second set of non-volatile storage cells (e.g., TLC storage cells). As used herein, refreshing data comprises performing one or more operations or processes on the data. In one embodiment, an ECC refresh for data may comprise performing an ECC decode to correct errors for the data and performing an ECC re-encode for the data to protect the data from subsequent errors. For example, the refresh module 304, in certain embodiments, may use an ECC decoder to decode the data and/or correct one or more data errors in the data and may use an ECC encoder to re-encode the data. In a further embodiment, the refresh module 304 may refresh and/or re-encode data by re-packetizing the data (e.g., removing headers or other metadata and reformatting the data with new headers or other metadata). Re-packetizing the data, in certain embodiments, may provide the refresh module 304 the chance to remove invalid data from a page or erase block being refreshed (e.g., data that has been overwritten by a write request for the same logical address).

Rather than refresh all data that the copyback module 306, described below, copies back to denser storage cells (e.g., from SLC storage cells to TLC storage cells), the refresh module 304 may selectively refresh data, determining whether or not to refresh data based on one or more attributes (e.g., data factors), or the like, for the data. Determining data factors or other attributes of data is described in greater detail below with regard to the data factor module 322 of FIG. 3B. In one embodiment, an attribute associated with data (e.g., a data factor) comprises a characteristic or aspect associated with stored data, with non-volatile storage cells storing data, or the like. A data factor or other attribute associated with data, in certain embodiments, may comprise an indicator of a likelihood that associated data has one or more data errors. A data factor or other attribute associated with data, in various embodiments, may include one or more of a quality-of-service (QoS) level or other priority for the data, an error rate for the data such as a raw bit error rate (RBER) or uncorrectable bit error rate (UBER), an age for the data (e.g., a retention time or time since written), a program/erase cycle count for the first/source set of non-volatile storage cells, a write frequency for the data, a read frequency for the data, a capacity threshold being satisfied for the first/source set of non-volatile storage cells, or the like. For example, the refresh module 304 may just refresh data having a certain error rate, data having a certain quality-of-service level, data older than a certain age or retention time threshold, or the like, allowing the copyback module 306 to copyback or move other data without the data being refreshed.

In one embodiment, the refresh module 304 and/or the data factor module 322 may determine whether or not to refresh data of a first, source set of storage cells (e.g., a logical or physical SLC page, a logical or physical SLC erase block) based on a data factor or other attribute for just a subset of the data, such as a single ECC code word or chunk, or the like and factoring in results of reading the subset of the data to determine one or more data factors or other attributes. For example, in embodiments where the refresh module 304 is configured to refresh data on a page by page basis, and a physical or logical page comprises multiple ECC code words or chunks, the refresh module 304 and/or the data factor module 322 may read and/or decode a subset of one or more ECC code words and determine whether or not to refresh the entire physical or logical page based on the results of reading the subset of ECC code words, such as an error rate, a number of errors, a quality-of-service or priority level indicated by metadata stored with the data, or the like. For example, if the refresh module 304 and/or the data factor module 322 determines that a sample ECC code word from a logical or physical page does not have any errors, does not have any uncorrectable errors, has a number of errors that do not satisfy a predetermined error threshold, or the like, the refresh module 304 may determine that the copyback module 306 may internally copy or move the logical or physical page back to a second, destination set of storage cells (e.g., a page of TLC storage cells) without refreshing the data.

In embodiments where a copyback and/or IDM operation comprises copying or moving multiple pages (e.g., copying three SLC pages to three TLC pages associated with the same set of TLC storage cells), the refresh module 304 may refresh one or more pages of the copyback and/or IDM operation without refreshing one or more other pages. The refresh module 304, in certain embodiments, may cooperate with the copyback module 306 to access data for refreshing, for determining whether to refresh data, or the like. In one embodiment, the copyback module 306, as described below, may read, load, move, and/or copy data from a first set of storage cells (e.g., a SLC page and/or erase block) into a volatile memory such as a volatile read buffer, a volatile program buffer, a cache buffer, or the like and the refresh module 304 may read or otherwise access the data from the volatile buffer to determine whether or not to refresh the data, to refresh the data, or the like.

For data that the refresh module 304 refreshes, in certain embodiments, the refresh module 304 may move, copy, or load the refreshed, re-encoded data back into the volatile memory, so that the copyback module 306 may complete the copyback and/or IDM operation using the refreshed, re-encoded data. As described in greater detail below, with regard to FIG. 4, a single non-volatile memory element 123 (e.g., a chip, a die, a die plane, a package, a bank, a channel, or the like of non-volatile memory media 122) may include non-volatile storage cells with different numbers of storage states or abodes, that encode different numbers of bits (e.g., one or more SLC erase blocks, one or more MLC erase blocks, one or more TLC erase blocks, or the like) and volatile memory (e.g., a volatile read buffer, a volatile program buffer, a cache buffer, or the like).

In certain embodiments, data that the refresh module 304 does not refresh, remains within the same non-volatile memory element 123 during the entire copyback or IDM procedure (e.g., copied or moved from a first set of storage cells to a volatile memory and from the volatile memory to a second set of storage cells). Data that the refresh module 304 refreshes and/or re-encodes, in one embodiment, may leave the associated non-volatile memory element 123, over a bus 127, 125 to the non-volatile memory media controller 126, to the SML 130, to host volatile memory 112, or the like for refreshing.

In certain embodiments, once the refresh module 304 has refreshed and/or re-encoded data, the refresh module 304 may move, copy, or load the data back into a volatile memory of the associated non-volatile memory element 123 so that the copyback and/or IDM operation may complete. In a further embodiment, at least for certain types of refreshing or re-encoding, such as re-packetizing the data, the refresh module 304 may place the data in a write pipeline 240, which may refresh, encode, and/or packetize the data. Instead of completing a copyback and/or IDM operation to the same non-volatile memory element 123 for data refreshed using the write pipeline 240, in certain embodiments, the refresh module 304 and/or the write pipeline 240 may write the refreshed data to a new location, such as an append point of a sequential, log-based writing structure, or the like. In certain embodiments, the new location may comprise storage cells having the same number of storage states, the same number of bits per cell, or the like as the first, source set of storage cells from which the data was read (e.g., back to a buffer of SLC storage cells), where the data may later be the subject of a subsequent copyback and/or IDM operation or the like.

By selectively determining whether or not to refresh data of a source page, source erase block, or the like (e.g., SLC storage cells) for a copyback and/or IDM operation, instead of simply refreshing all data, the refresh module 304 may reduce the amount of data that is copied off of a non-volatile memory element 123 during copyback and/or IDM operations. The refresh module 304 may thereby avoid the performance penalty of refreshing certain data, while still refreshing other data to correct certain data errors. In this manner, the refresh module 304 may optimize the on die buffered copyback and/or IDM operation for the non-volatile memory media 122, by optimally determining whether a page being moved (e.g., from SLC storage cells to TLC storage cells) should be error-checked and/or corrected before being moved (e.g., to a TLC page). As described above, the process of decoding an ECC code word, correcting one or more errors, and re-encoding the code word may be referred to as a refresh, a data refresh, an encoding refresh, a re-encode, a data re-encode, or the like.

Although, in certain embodiments, a manufacturer of the non-volatile memory media 122 may recommend that all data of a copyback and/or IDM operation be refreshed, the refresh module 304 may selectively determine whether or not to refresh data, only refreshing a subset of data that the copyback module 306 copies back. In one embodiment, the refresh module 304 may not refresh any copyback data, such that all or substantially all of the data remains on the non-volatile memory element 123 during the copyback and/or IDM operation.

In certain embodiments, the copyback module 306 may use a predetermined, predefined, or known selection process to determine a location in the second, destination set of storage cells at which to move or copyback data, based on an address or other identifier of the source and/or destination storage cells. If the destination set of storage cells (e.g., a TLC erase block or the like) is not usable (e.g., is retired, bad, worn out, has errors, or is otherwise unavailable to store data), the copyback module 306 may not be able to move or copy data to the destination. Rather than alter the predefined destination selection process, in certain embodiments, the refresh module 304 may be configured to perform a refresh operation for data destined for an unusable or unavailable set of storage cells so that the data is written to a different location. For example, the refresh module 304 may perform an extended refresh operation, such as re-packetizing the data in addition to re-encoding the data with an ECC encoder, and may write the data to the different location, such as an append point of a sequential, log-based, writing structure, using the write pipeline 240 or the like. In this manner, unusable or unavailable destinations may be skipped for copyback and/or IDM operations, without modifying or altering a predefined destination selection process.

As described below with regard to FIGS. 8A and 8B, in certain embodiments, the non-volatile memory elements 123 may be physically or logically arranged in an array and the array may be organized into rows of n die wide (e.g., n=29 columns=28 data die+1 parity die, or the like), with physical erase blocks in the row being managed as a logical erase block, or the like. Rows of the array, in one embodiment, may be managed using adaptive flashback, meaning that as a physical erase block in a row fails, rather than re-mapping another erase block to maintain the same row width, the row size may be reduced and a shorter row used.

However, if a destination logical erase block for a copyback and/or IDM operation has a shorter row and fewer physical erase blocks than the source logical erase block, the copyback and/or IDM operation cannot complete for each physical erase block. Consequently, in order for copyback and/or IDM to be used between two rows of the array, the number of usable physical erase blocks in each row should be at least the same for each copyback and/or IDM operation. In other words, the destination row (e.g., TLC row) should be as wide as, or wider than, the source row (e.g., SLC row). If the destination row is not as wide as the source row, in certain embodiments, the copyback module 306 may select a different destination for the data, such as an alternative erase block chosen from a pool of reserved erase blocks set aside for this purpose. In a further embodiment, if the destination row is not as wide as the source row, the copyback module 306 may cooperate with the refresh module 304 to refresh the data (e.g., re-encode, re-packetize, or the like) and to redirect the source data to a different location, such as an append point of the sequential, log-based writing structure, using the write pipeline 240 or the like, instead of completing the copyback and/or IDM operation.

The refresh module 304, in one embodiment, may comprise logic in the non-volatile memory media controller 126, such as the read pipeline 241, the write pipeline 240, or the like. The refresh module 304 may determine whether or not to do an encoding refresh within the controller 126, in certain embodiments, and if the refresh module 304 determines to perform an encoding refresh, the refresh module 304 may decode and re-encoded the data into one or more new ECC codewords within the controller 126. In a further embodiment, data that the refresh module 304 refreshes may remain in the controller 126, without being sent or copied over the bus 125 to main volatile memory 112 of the host computing device 110 during the refresh.

The refresh module 304 may be configured to quickly and efficiently determine whether data is to be refreshed, based on available information (e.g., attributes associated with data, data factors), or the like. In certain embodiments, as described below with regard to the data factor module 322, the refresh module 304 and/or the data factor module 322 may use a predetermined model or characterization associated with a set of storage cells to predictively determine whether or not to refresh data of the storage cells, without necessarily reading or otherwise processing the data from the storage cells. In a further embodiment, as described below, the data factor module 322 may scan the non-volatile memory media 122 as a background process, to determine one or more data factors or other attributes for the data, to determine whether or not the refresh module 304 is to refresh the data, or the like such that the refresh module 304 may simply lookup or reference data factors and/or a determination of whether to refresh data in response to a copyback and/or IDM operation for the data.

In certain embodiments, the refresh module 304 may be configured to perform a garbage collection or storage capacity recovery operation for data in association with a refresh procedure, as described in greater detail below with regard to the storage capacity recovery module 318. For example, the refresh module 304 and/or the storage capacity recovery module 318 may remove invalid data (e.g., data that has been replaced or overwritten by a subsequent write operation for the same addresses) from data being refreshed for a copyback and/or IDM operation. In this manner, the refresh module 304 may reduce the size of the data, effectively compacting or compressing the data. The refresh module 304, in one embodiment, may cooperate with the write pipeline 240, described above, to re-encode and/or re-packetize data after the invalid portions have been removed.

In a further embodiment, the copyback module 306 may move, copyback all data from a first set of storage cells (e.g., SLC storage cells) and the refresh module 304 may perform a refresh operation, for at least a subset of the data, after the copyback module 306 has copied the data back to or otherwise stored the data in a second set of storage cells. The refresh module 304 may determine which data to refresh based on one or more data factors or other attributes associated with data, as described above. In certain embodiments, the refresh module 304 may determine which data to refresh based on an aspect or attribute of the copyback and/or IDM operation itself, such as a program time (e.g., Tprog) for the copyback and/or IDM operation, errors detected during the copyback and/or IDM operation, or the like. Performing a refresh operation after a copyback and/or IDM procedure, in some embodiments, may allow more errors than performing a copyback and/or IDM operation prior to or during a copyback and/or IDM procedure, but may allow the refresh to occur during low-pressure, off-peak times, may allow the copyback and/or IDM procedure to occur more quickly, or the like.

The refresh module 304, in certain embodiments, may cooperate with the copyback module 306 to determine a destination for refreshed data. For example, as described above, if a destination set of storage cells (e.g., TLC storage cells) exceeds or otherwise satisfies a wear and/or error threshold (e.g., exceeds a predefined program/erase cycle count, error rate, or the like), the refresh module 304 and/or the copyback module 306 may determine that the data should instead be written to a different location, such as an append point of the sequential, log-based writing structure (e.g., to a different set of SLC storage cells), to an alternate set of storage cells (e.g., to a different set of TLC storage cells), or the like instead of to the originally determined destination. In one embodiment, if the refresh module 304 determines that the data of a copyback and/or IDM operation is in low demand (e.g., a read count for the data fails to satisfy a predefined frequency threshold), the refresh module 304 may cooperate with the storage capacity recovery module 318 to remove invalid data and may redirect the data to the append point of the sequential, log-based writing structure.

In one embodiment, the copyback module 306 is configured to determine when and/or if a copyback and/or IDM operation is to be performed for data (e.g., whether or not data from a set of SLC storage cells is to be stored in a set of TLC storage cells). The copyback module 306 may selectively perform copyback and/or IDM operations (e.g., between SLC storage cells and TLC storage cells) such that not all data is moved or copied from the source set of storage cells and stored in the destination set of storage cells. In embodiments where the source, buffer set of storage cells has fewer storage states, encoding or representing a lower number of bits than the destination set of storage cells, the source set of storage cells may have faster read times, faster write/program times, less cell leakage, or other better, more robust access characteristics than the destination set of storage cells, other than storage capacity. The copyback module 306 may determine whether or not to store, move, or copyback data based on one or more data factors or other attributes associated with the data.

The copyback module 306, in one embodiment, stores data in a second/destination set of storage cells subsequent to the buffer module 302 storing the data in a first/source set of storage cells. In certain embodiments, the copyback module 306 is configured to minimize an amount of time between when data is stored in a first/source set of non-volatile storage cells and when the copyback module 306 copies, moves, or otherwise stores the data from the first/source set of non-volatile storage cells to a second/destination set of non-volatile storage cells (e.g., from SLC cells to TLC cells). For example, in one embodiment, the copyback module 306 may immediately or substantially immediately determine whether or not to copy data back to a second/destination set of cells in response to the data being written to a first/source set of cells and immediately or substantially immediately store the data in the second/destination set of cells in response to making the determination.

By determining whether or not to copy or move data back from a first/source set of cells to a second/destination set of cells and copying or moving the data as soon as possible, in one embodiment, the copyback module 306 may reduce or prevent errors that may occur in the data prior to being copied or moved to the second/destination set of cells. In a further embodiment, by performing a copyback and/or IDM operation on data as soon as possible, the copyback module 306 may reduce the amount of data for which the refresh module 304 performs refresh operations, as a number of errors in the data may be less than if the data was stored in a first/source set of cells for a longer period of time.

Performing a copyback and/or IDM operation for data as soon as possible, in certain embodiments, may not negatively impact or slow down operation of a storage client 116 or other process of the host computing device 110 that wrote the data to the non-volatile memory device 120. For example, in one embodiment, the write pipeline 240, the power-cut module 320, the non-volatile memory media controller 126, the SML 130, or the like may acknowledge completion of a write request for the data to a requesting storage client 116 in response to storing the data in a write buffer of the non-volatile memory media controller 126, of the non-volatile memory media 122, or the like, as the power-cut module 320 may ensure that the data is stored in a first/source set of storage cells even if a power failure or interruption occurs, as described below. In a further embodiment, the write pipeline 240, the power-cut module 320, the non-volatile memory media controller 126, the SML 130, or the like may acknowledge completion of a write request for the data to a requesting storage client 116 in response to storing the data in a first/source set of storage cells. In either embodiment, storage of the data may be acknowledged to a requesting storage client 116 before the copyback module 306 performs a copyback and/or IDM operation, so that performance of the operation may have little or no impact on operation of the requesting storage client 116 or completion of the associated write request.

Determining data factors or other attributes associated with data is described in greater detail below with regard to the data factor module 322 of FIG. 3B. In one embodiment, an attribute of data (e.g., a data factor) comprises a characteristic or aspect associated with stored data, with non-volatile storage cells storing data, or the like. A data factor or other attribute associated with data, in certain embodiments, may comprise an indicator of a likelihood that associated data has one or more data errors. A data factor or other attribute associated with data, in various embodiments, may include one or more of a quality-of-service level or other priority for the data, an error rate for the data such as a raw bit error rate (RBER) or uncorrectable bit error rate (UBER), an age for the data (e.g., a retention time or time since written), a program/erase cycle count for the storage cells, a write frequency for the data, a read frequency for the data, a capacity threshold being satisfied for the storage cells, a duration of a program operation for the storage cells, or the like. For example, the copyback module 306 may just move or copyback data having a certain quality-of-service level, data older than a certain age or retention time threshold, or the like, allowing other data to remain in the first/source set of non-volatile storage cells (e.g., SLC storage cells) without being copied back.

The first/source set of storage cells (e.g., SLC storage cells) may have a higher reliability, faster access times (e.g., read times and/or write/program times) than the second/destination set of storage cells. Leaving some data in the first/source set of storage cells may allow the copyback module 306 to achieve certain quality-of-service, reliability, and/or performance requirements for the data. In certain embodiments, the copyback module 306 may verify storage of and/or data integrity of data in the second/destination set of non-volatile storage cells. The copyback module 306 may verify storage of and/or data integrity of the data by reading the data from the second/destination set of non-volatile storage cells, by receiving a completion indicator or confirmation from the non-volatile memory media 122, by performing error correction on the data, by comparing the read data to known or expected data, or the like. In one embodiment, the copyback module 306 may delay verifying storage of the data in the second/destination set of non-volatile storage cells until a later time, in response to a trigger or the like. For example, the copyback module 306 may verify storage of and/or data integrity of the data in response to a read request for the data, a background scan of the second/destination set of non-volatile storage cells, a storage capacity threshold being satisfied (e.g., for the first/source set of non-volatile storage cells, for the non-volatile memory media 122, for the non-volatile memory device 120), a storage capacity recovery event for the first/source set of non-volatile storage cells, or the like. By delaying verification of the data, in certain embodiments, the copyback module 306 may verify the data after the data has already been read from the second/destination set of non-volatile storage cells for a different purpose (e.g., to satisfy a read request for the data or the like).

The copyback module 306, in one embodiment, may use an internal data transfer command, such as a copyback and/or IDM command, of a non-volatile memory element 123 to internally copy or move data from a first/source set of non-volatile memory cells to a second/destination set of non-volatile memory cells. The internal data transfer command (e.g., copyback and/or IDM command) may perform a copyback and/or IDM operation for data located within a single non-volatile memory element 123 (e.g., integrated circuit chip, die, and/or die plane) internally within the non-volatile memory element 123, without the data leaving the non-volatile memory element 123, a package of the non-volatile memory element 123 (e.g., chip, die, and/or die plane), or the like. For example, the non-volatile memory media 122 may support a copyback command, an IDM command, or another internal data transfer command and the copyback module 306 may provide a source and destination with each copyback and/or IDM command. As part of the internal data transfer operation, the copyback module 306 and/or the non-volatile memory media 122 may move, copy, or load data from a first/source set of storage cells (e.g., SLC storage cells) into a volatile memory (e.g., a page buffer) of the associated non-volatile memory element 123, where the refresh module 304 may selectively refresh the data or the like. The copyback module 306 may then internally copy or move the data from the volatile memory to the second, destination set of storage cells. In certain embodiments, the copyback module 306 may load multiple pages or other sets of data into the volatile memory (e.g., three pages of data from SLC pages for copyback to TLC pages).

Figure 3B:
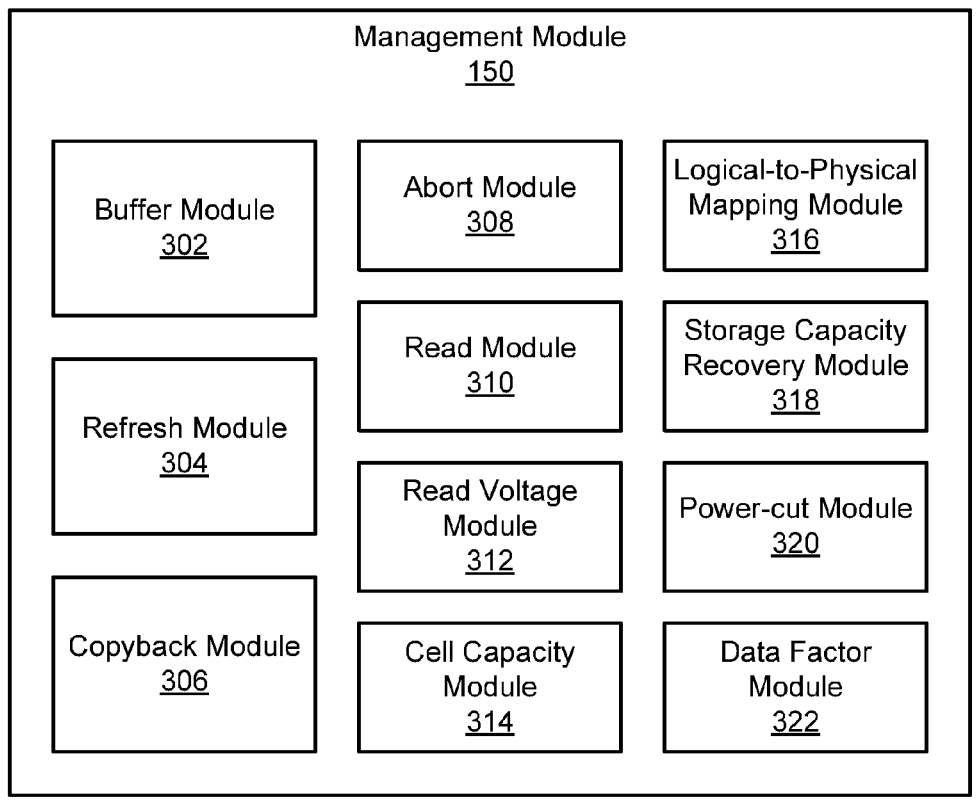
FIG. 3B is a schematic block diagram illustrating another embodiment of a management module.

FIG. 3B depicts a further embodiment of a management module 150. The management module 150 may be substantially similar to the management module 150 described above with regard to FIG. 1 and FIG. 3A. In the depicted embodiment, the management module 150 includes the buffer module 302, the refresh module 304, and the copyback module 306 and further includes an abort module 308, a read module 310, a read voltage module 312, a cell capacity module 314, a logical-to-physical mapping module 316, a storage capacity recovery module 318, a power-cut module 320, and a data factor module 322.

In one embodiment, the abort module 308 is configured to abort, stop, cancel, and/or interrupt an in-process copyback and/or IDM procedure of the copyback module 306 in response to the copyback module 306 determining not to copy or move the associated data to a second/destination set of storage cells, based on one or more data factors or the like. In certain embodiments, the abort module 308 is configured to abort, stop, cancel, and/or interrupt an in-process copyback and/or IDM procedure of the copyback module 306 in response to the power-cut module 320 determining or detecting that a power level for the non-volatile memory device 120 has failed to satisfy a power threshold. Aborting an in-process copyback and/or IDM procedure in response to a power failure, in certain embodiments, may conserve power, allowing other commands or procedures to complete.

The abort module 308, in one embodiment, may abort a copyback and/or IDM procedure by issuing a reset command to a non-volatile memory element 123 associated with the copyback and/or IDM procedure. In a further embodiment, the abort module 308 may abort a copyback and/or IDM procedure by ignoring and/or overwriting data loaded into volatile memory (e.g., a volatile page buffer) for the copyback and/or IDM procedure, by starting a next copyback and/or IDM procedure or the like.

In one embodiment, the read module 310 is configured to service read requests from the non-volatile memory media 122. The read module 310 may cooperate with and/or be integrated with the read pipeline 241 described above. Due to the copyback and/or IDM process, there may be times when multiple copies of the same data exists in the non-volatile memory medium 122. The read module 310, in certain embodiments, may favor data stored in storage cells with fewer storage states and bits per cell. For example, if data is stored in both SLC storage cells and TLC storage cells, the read module 310 may be configured to service a read request for the data from the SLC storage cells.

As described below with regard to the storage capacity recovery module 318, data that has been copied back may remain stored in the first/source set of storage cells after the copyback and/or IDM operation, until the storage capacity is needed or the like. For example, the storage capacity recovery module 318 may leave frequently accessed data, data having a certain quality-of-service or other priority level, or the like in the first/source set of storage cells and recover storage capacity of other sets of storage cells (e.g., erase blocks with a lower percentage or ratio of frequently accessed data, of high QoS or other priority data) so that the read module 310 may service read requests from the first/source set of storage cells for as long as possible. The read module 310 may continue to service read requests from the first/source set of storage cells until the storage capacity is recovered and the associated data is erased. In response to the data being erased from the first/source set of storage cells (e.g., SLC storage cells), by the storage capacity recovery module 318 or the like, the read module 310 may service read requests for the data from the second/destination set of storage cells (e.g., TLC storage cells). In embodiments where the copyback module 306 determines not to perform a copyback and/or IDM operation for data to internally copy or move the data back to a second/destination set of storage cells (e.g., TLC storage cells), the read module 310 may continue to service read requests for the data from the first/source set of storage cells.

In certain embodiments, the non-volatile memory media 122 may be configured to rely on a program disturb effect caused by programming a next, adjacent page or wordline to complete the programming of a first page or wordline. A manufacturer may specify a page or wordline programming order. The page or wordline programming order may require that a lower page of WLn be programmed with a first page and a lower page of WLn+1 be programmed with a second page and a middle page of WLn be programmed with a third page. Furthermore, the manufacturer page programming order may require that the middle page of WLn+1 be programmed with a fourth page and an upper page of WLn be programmed with a fifth page. In this manner, wordlines are progressively used to store pages of data in an order that improves the data integrity in the cells.

A manufacturer of the non-volatile memory media 122 may recommend, or require, that a next, adjacent page or wordline be programmed before a first page or wordline may be read, at least for TLC storage cells. For example, a manufacturer may specify that wordline WLn not be read until after wordline WLn+1 is programmed. Such a restriction, may delay the servicing of a read request for a previously programmed page (e.g. on WLn). As used herein with regard to pages or wordlines, "adjacent" or "next," in one embodiment, comprises numerically and/or logically consecutive pages or wordlines within a specified programming order or addressing order. In other embodiments, "adjacent" or "next" may refer to physically or temporally contiguous or adjoining pages or wordlines within a non-volatile memory element 123.

The read module 310, in certain embodiments, may be configured to service read requests for a page or wordline even before or prior to a next or adjacent page or wordline being programmed (e.g., service a read request for WLn before WLn+1 is programmed). The read module 310, in one embodiment, is configured to only service a read request for a page or wordline prior to a next, adjacent page or wordline being programmed in response to the read module 310 determining that errors in the data are correctable, using an ECC encoding for the data or the like. The read module 310 may cause the read request to fail, return an error, send a notification or other message, or the like to a requesting storage client 116 if errors in the data cannot be corrected. In another embodiment, the read module 310 may return data of a read request even if errors in the data are uncorrectable. Servicing read requests for data, even before a next, adjacent page or wordline has been written/programmed, in certain embodiments, may increase performance by making the data accessible sooner.

In one embodiment, the read voltage module 312 manages and adjusts one or more read voltage thresholds for the first/source storage cells of the non-volatile memory media 122, which have less storage states for encoding fewer bits than the second/destination storage cells (e.g., SLC storage cells used to buffer data for TLC storage cells). The stored read voltage levels for storage cells may drift or change over time, due to disturb effects such as read disturb or program disturb, due to wear on the storage cells due to high program/erase counts, due to manufacturer defects, or the like. As described above with regard to the refresh module 304, errors introduced in the first/source storage cells (e.g., SLC storage cells) may be amplified as the data is copied back to the second/destination storage cells (e.g., TLC storage cells), requiring the refresh module 304 to refresh the data being copied back to correct the errors, adding processing and bandwidth overhead.

In order to reduce the amount of data that the refresh module 304 refreshes for copyback and/or IDM operations and/or to extend an amount of time that data may be stored in first/source storage cells prior to copyback, in certain embodiments, the read voltage module 312 may adjust one or more read voltage thresholds to counteract or compensate for changes in stored voltage levels to reduce errors. The read voltage module 312, in one embodiment, determines a read voltage threshold for a set of storage cells based on one or more storage media characteristics for the associated set of storage cells. For example, the read voltage module 312 may determine one or more read voltage thresholds for a set of storage cells proactively in an open-loop manner based on one or more storage media characteristics for the set of storage cells, without reading data from the set of storage cells as feedback for the determination.

As used herein, an "open-loop" determination comprises a determination that is not made based on feedback or another indicator or measurement of a result of the determination. For example, in certain embodiments, the read voltage module 312 may determine an adjusted or updated read voltage threshold for a set of storage cells based on one or more storage media characteristics without first reading data from the set of cells as feedback, in an open-loop manner. The storage media characteristics may be determined based on previous research and development testing of the storage media device (e.g. device characterization). A "closed-loop" determination, as used herein, comprises a determination that is made or updated based at least partially on some feedback or other indicator or measurement of the results of the determination. For example, the read voltage module 312, in one embodiment, may iteratively update a read voltage threshold for a set of storage cells based on data read back from the storage cells (e.g., an error rate for the data, a comparison of the data with known data, or the like). In certain embodiments, the read voltage module 312 may initially determine a read voltage threshold for a set of storage cells in an open-loop manner, based on one or more storage media characteristics for the set of storage cells or the like, and may subsequently fine-tune or adjust the read voltage threshold in a closed-loop manner, by reading data from the set of storage cells and updating or otherwise adjusting the read voltage threshold based on an error rate or other feedback.

In one embodiment, the read voltage module 312 references or otherwise determines one or more media characteristics for a set of storage cells of the non-volatile memory media 122, for abodes or storage states of a set of storage cells of the non-volatile memory media 122, or the like. The set of storage cells may comprise a single storage region, such as a physical page, a logical page, a physical erase block, a logical erase block, a wordline, an ECC chunk/codeword, a chip, a die, a plane in a die, or the like, or may comprise a set of multiple storage regions. In certain embodiments, different storage states, abodes, encoding digits (e.g., LSB, MSB) of the storage cells of the non-volatile memory media 122 may have different media characteristics, and the read voltage module 312 may monitor or otherwise determine the different media characteristics separately for different abodes/storage states, or the like.

The read voltage module 312 may determine one or more media characteristics itself, may receive media characteristics from another module, may retrieve media characteristics from a media characteristic repository, or the like. A media characteristic is a statistic, heuristic, or other descriptor associated with an attribute of the non-volatile memory media 122. Media characteristics may include and/or relate to a make, a model, a manufacturer, a product version, or the like for the non-volatile memory device 120 and/or for the non-volatile memory media 122; an attribute or statistic for a set of storage cells; an environmental condition or a use case of the non-volatile memory device 120 and/or of the non-volatile memory media 122; and/or another statistic, heuristic, or other descriptor for an attribute of the non-volatile memory media 122.

A media characteristic for a set of storage cells affects or informs the determination of a read voltage threshold for the set of storage cells. In one embodiment, the media characteristics include a program/erase cycle count for a set of storage cells. In another embodiment, the media characteristics include a read count for a set of storage cells. The media characteristics, in a further embodiment, include a retention time since a previous write for a set of storage cells. In an additional embodiment, the media characteristics include a temperature for a set of storage cells. The media characteristics, in certain embodiments, include a use case for a set of storage cells. In another embodiment, the media characteristics include an error statistic for a set of storage cells, such as an UBER, a RBER, or the like. In a further embodiment, the media characteristic may include previous or historical read voltage thresholds for a set of storage cells, read voltage thresholds or media characteristics for other sets of storage cells, or the like.

The read voltage module 312, in certain embodiments, manages the collection of and/or maintenance of media characteristics. The read voltage module 312 may maintain media characteristics in and/or retrieve media characteristics from a media characteristic repository. The read voltage module 312, in certain embodiments, references, determines, and/or manages media characteristics for several different sets of storage cells, such as each storage region or storage division of the non-volatile memory device 120. A media region may include an erase block (logical or physical), a page (logical or physical), an ECC chunk/codeword, a division within a page, a set of pages, a die, a plane in a die, a chip, or the like.

In one embodiment, the read voltage module 312 may be similar to, may work with, and/or may be integrated with the data factor module 322 described above with regard to FIG. 3B. For example, the media characteristics may include one or more of the statistics described above with regard to the data factor module 322, such as a temperature for the non-volatile memory device 120, an error rate for the non-volatile memory device 120 (such as an UBER, RBER, or the like), a program/erase cycle count for the non-volatile memory device 120, a storage request latency for the non-volatile memory device 120 (such as an average, maximum, or other storage request execution latency), an age of the non-volatile memory device 120, and/or other statistics or characteristics. The read voltage module 312, in certain embodiments, may receive input, directly or indirectly, from one or more sensors, from other modules or elements such as an ECC decoder, or the like.

In one embodiment, the read voltage module 312 determines a read voltage threshold for a set of storage cells based on one or more media characteristics for the set of storage cells. The set of storage cells for which the read voltage module 312 determines the read voltage threshold may include an erase block (logical or physical), a page (logical or physical), an ECC chunk/codeword, a division within a page, a set of pages, a die, a plane in a die, a chip, or the like. The read voltage module 312 may determine different read voltage thresholds for different sets of storage cells, different sets of pages, different abodes/storage states of storage cells, or the like, based on the corresponding media characteristics. The read voltage module 312, in certain embodiments, determines read voltage thresholds dynamically during operation or runtime of the non-volatile memory device 120, as adjustments or updates to initial or default settings.

As described above, a read voltage threshold is a parameter of a set of storage cells that is modifiable by way of an interface to distinguish stored values, such as binary ones and zeroes. The read voltage module 312 may determine a read voltage threshold as an absolute data value, as an offset or adjustment to a data value, or as another parameter with which the read voltage module 312 can configure a set of storage cells.

The read voltage module 312 may base a read voltage threshold on one or more media characteristics by entering the one or more media characteristics into an equation, into a mathematical model, into a lookup table (LUT), into a matrix, or the like; by performing a predefined transform or operation on the one or more media characteristics; or by otherwise referencing and/or manipulating the one or more media characteristics to determine the read voltage threshold. A read voltage threshold equation, mathematical model, LUT, matrix, or the like may be based on empirical data, such as test data, historical data, and the like. A design engineer or the like, in one embodiment, may test sets of storage cells with various media characteristics, such as non-volatile memory media from various manufacturers or the like, and determine optimal read voltage thresholds for storage cells with the various media characteristics. For example, an equation, mathematical model, LUT, matrix, or the like may indicate that non-volatile memory media 122 from manufacturer X tends to have Y amount of natural drift in cell values after 1,000 program/erase cycles such that a read threshold can be increased by Z volts to compensate, or the like.

In other embodiments, the read voltage module 312 may dynamically determine a read voltage threshold; an equation, mathematical model, LUT, matrix, transform, or the like to define a read voltage threshold; an adjustment to a read voltage threshold; or the like during operation of the non-volatile memory device 120, as described above with regard to the adjustment module 408. For example, the read voltage module 312 may determine read voltage thresholds for various media characteristics initially based on a default value, based on trial and error, or the like and may autonomously correlate the effectiveness of the read voltage threshold, based on a change in an error rate such as RBER, UBER, a program/erase count, or the like, to determine an equation, mathematical model, LUT, matrix, transform, or the like for determining subsequent read voltage thresholds and/or read voltage threshold adjustments.

In one embodiment, the media characteristics for a set of storage cells include a temperature. A temperature for a set of storage cells may affect the speed of the effects of one or more other media characteristics on the set of storage cells. For example at higher temperatures, the rate of change for media characteristics relating to error statistic such as Raw Bit Error Rates (RBER) and data retention times may increase and certain adjustments to read voltage thresholds may mitigate the effect. In certain embodiments, the read voltage module 312 may adjust or scale a read voltage threshold, a media characteristic, or the like by a temperature to compensate for the effects of temperature, normalizing the data for temperature. The temperature for a set of storage cells may be an average temperature, a temperature over a sliding window, a current temperature, a temperature for the non-volatile memory device 120, or another temperature measurement associated with one or more sets of storage cells.

The one or more media characteristics, in one embodiment, indicate to the read voltage module 312 a trend, an optimization, or the like for a read voltage threshold and the read voltage module 312 determines a read voltage threshold to satisfy the trend or optimization. For example, a magnitude of a program/erase cycle count, a read count, a UBER, a RBER, or another media characteristic may indicate an amount that a read voltage or other read voltage threshold has drifted, and the read voltage module 312 may proactively determine a read voltage threshold based on the media characteristic, without direct feedback from the storage cells, such as a read, a read retry, or the like.

In one embodiment, the read voltage module 312 maintains read voltage thresholds for sets of storage cells of different storage regions or storage divisions of the non-volatile memory media 122, such as an erase block (logical or physical), a page (logical or physical), an ECC chunk/codeword, a division within a page, a set of pages, an abode/storage state, a die, a plane in a die, a chip, or the like, in a read voltage threshold repository. By determining and managing separate media characteristics and/or read voltage thresholds for different storage regions, for different abodes/storage states, or the like, the read voltage module 312, in certain embodiments, may customize read voltage thresholds for each storage region or abode/storage state individually, thereby reducing errors, extending the lifetime of the non-volatile memory media 122, or the like.

Different abodes/storage states of storage cells may have different media characteristics. For example, certain abodes/storage states, such as the L0 state, may be more prone to program, read, or other disturbances. An abode or storage state, as used herein, is the range of read levels, such as a read voltage level for flash media, a read resistivity level for PCM media, or the like, associated with a particular set of data values. Read thresholds, such as a read voltage threshold, a read resistivity threshold, or the like, may separate abodes or storage states. One example of abodes or storage states is described below with regard to FIG. 9A.

In certain embodiments, the read voltage module 312 determines and/or adjusts read voltage thresholds only for copyback and/or IDM operations from a first/source set of storage cells (e.g., SLC storage cells) to a second/destination set of storage cells (e.g., TLC storage cells), to reduce errors, to reduce the amount of data refreshes, or the like. In such embodiments, the read voltage module 312 may not determine or adjust a read voltage threshold for a standard, workload read operation, in response to a read request from a storage client 116, or the like, but may use a default read voltage threshold, or the like. The read voltage module 312, in a further embodiment, may use an adjusted read voltage threshold just for storage cells (e.g., pages, erase blocks, or other sets of storage cells) having predefined media characteristics, while using a default read voltage threshold for other storage cells. In one embodiment, the proactive read voltage threshold model used by the read voltage module 312 may also indicate one or more pages, erase blocks, or other sets of storage cells which the refresh module 304 is to refresh during a copyback and/or IDM operation.

While SLC storage cells, in certain embodiments, may be considered relatively robust and reliable, at least in comparison to MLC or TLC storage cells, toward the end of the lifetime of the SLC storage cells, for SLC storage cells that have been used as MLC and/or TLC storage cells as described below with regard to the cell capacity module 314, or the like, data errors may be introduced quickly, leaving a limited window in which to move or copyback the data without errors. By adjusting one or more read voltage thresholds for the first/source set of storage cells, the read voltage module 312 may extend this window, allowing data to be stored in the first/source set of storage cells for a longer period of time while still minimizing the amount of refreshes for movement or copyback to the second/destination set of storage cells.

In one embodiment, the cell capacity module 314 is configured to dynamically adjust the number of bits stored per cell for the non-volatile memory media 122, by adjusting the ratio of SLC storage cells or erase blocks, MLC storage cells or erase blocks, TLC storage cells or erase blocks, or the like. The non-volatile memory media 122, in certain embodiments, may be preconfigured by a manufacturer with a predetermined ratio of SLC erase blocks and TLC erase blocks, such as 1.2% SLC erase blocks and 98.8% TLC erase blocks, or another predetermined ratio. The manufacturer's predetermined ratio, however, may not be optimal for a use case of the non-volatile memory device 120. Further, a manufacturer's allocation of SLC and TLC erase blocks is typically static, with the same storage cells being set as SLC storage cells or as TLC storage cells for the lifetime of the device 120.

The cell capacity module 314, in one embodiment, determines an allocation of different types of storage cells and/or erase blocks (e.g., SLC, MLC, and/or TLC) to maximize a lifetime of the non-volatile memory media 122. In a further embodiment, the cell capacity module 314 may determine an allocation of different types of storage cells and/or erase blocks (e.g., SLC, MLC, and/or TLC) to maximize performance of the non-volatile memory media 122. In another embodiment, the cell capacity module 314 may determine an allocation of different types of storage cells and/or erase blocks (e.g., SLC, MLC, and/or TLC) to maximize a storage capacity of the non-volatile memory media 122. The cell capacity module 314, in certain embodiments, may provide a user interface allowing a storage client 116 or other user to determine an allocation of different types of storage cells and/or erase blocks (e.g., SLC, MLC, and/or TLC).

The cell capacity module 314, in certain embodiments, determines an allocation of different types of storage cells and/or erase blocks (e.g., SLC, MLC, and/or TLC) based on one or more data factors or other attributes for data of the non-volatile memory device 120. For example, in one embodiment, the cell capacity module 314 may increase the number of erase blocks in SLC mode relative to a number of erase blocks in TLC mode as a quality-of-service or other priority level for the data increases, may lower the number of erase blocks in SLC mode relative to a number of erase blocks in TLC mode as a quality-of-service or other priority level for the data decreases, or the like, so that data with a higher quality-of-service or other priority level may be stored in SLC storage cells. In this manner, in certain embodiments, the cell capacity module 314 may provide differentiated quality-of-service (QoS) levels using different types of storage cells and/or erase blocks (e.g., storing high QoS level data in SLC cells, medium QoS level data in MLC cells, storing low QoS level data in TLC cells, or the like) and may dynamically adjust or change the allocation of storage cells in various modes to accommodate the nature of the data (e.g., SLC mode, MLC mode, TLC mode).

In one embodiment, the cell capacity module 314 determines a static allocation of different types of storage cells and/or erase blocks (e.g., SLC and TLC), which the cell capacity module 314 uses throughout the lifetime of the non-volatile memory media 122. In other embodiments, the cell capacity module 314 may dynamically update and adjust an allocation of different types of storage cells and/or erase blocks (e.g., SLC and TLC), as the non-volatile memory ages (e.g., based on a program/erase count, an age in time, or the like), as a use case for the non-volatile memory device 120 changes (e.g., a cache device, a backup device, server device, high write load device, high read load device, low write load device, low read load device, or the like).

In certain embodiments, the cell capacity module 314 may dynamically change, rotate, or wear-level which sets of storage cells (e.g., erase blocks) are configured as SLC storage cells, MLC storage cells, TLC storage cells, and/or other levels of storage cells over time. In one embodiment, the cell capacity module 314 may assign which sets of storage cells (e.g., erase blocks) are configured with different levels or numbers of bits per cell substantially evenly, wear-leveling which storage cells are assigned with different levels (e.g., SLC, MLC, TLC). For example, for on die buffered non-volatile memory media 122 with SLC and TLC storage cells, the cell capacity module 314 may rotate which erase blocks are configured as SLC and which as TLC substantially evenly, as erase blocks are selected for storage capacity recovery or the like, so that each erase block spends a substantially equal time in use as SLC storage as in use as TLC storage. In another embodiment, the cell capacity module 314 may select erase blocks or other sets of storage cells for lower number of bits per cell (e.g., SLC) that have higher error rates, higher program/erase counts, or the like than other erase blocks, which the cell capacity module 314 may select for higher numbers of bits per cell (e.g., TLC). For example, the cell capacity module 314 may allocate cell modes such that a usable lifetime (e.g., an amount of time) is substantially equal for each set of storage cells, so that the different sets of storage cells wear out at or near the same time.

In one embodiment, the non-volatile memory media 122 may support an operation or command to set the number of bits per cell (e.g., SLC mode, MLC mode, and/or TLC mode), such as a SET FEATURE command or the like. In a further embodiment, the cell capacity module 314 may set the number of bits per cell (e.g., SLC mode, MLC mode, and/or TLC mode) without an operation or command by adding or adjusting one or more read voltage thresholds in cooperation with the read voltage module 312, or the like. For example, even if the non-volatile memory media 122 does not support or provide a MLC mode, the cell capacity module 314 and/or the read voltage module 312 may logically add read voltage thresholds to an SLC mode or logically remove (e.g., ignore, compress, overlap) read voltage thresholds from a TLC mode to operate a set of storage cells in a virtual MLC mode, or the like.

The cell capacity module 314, in certain embodiments, may set a mode for a set of storage cells once for each allocation, the non-volatile memory media 122 using the set mode until it is changed. In a further embodiment, the cell capacity module 314 may set the mode with each command or operation. The cell capacity module 314, in one embodiment, may maintain metadata indicating which erase blocks or other sets of storage cells are allocated in different modes, such that the cell capacity module 314 may make the allocation consistent, even if the non-volatile memory device 120 is reset or powered down.

In certain embodiments, the cell capacity module 314, in cooperation with the data factor module 322, the storage capacity recovery module 318, or the like, may monitor or track one or more statistics for each erase block, such as an error rate (e.g., RBER, UBER), a program/erase count, a T-erase time that it takes to erase an erase block, a T-prog time that it takes to program an erase block, and/or another storage media characteristic, data factor, and/or attribute associated with data with each storage capacity recovery event, as a periodic background scan of the non-volatile memory media 122, or the like. T-erase, T-prog, or the like may increase over time as storage cells age and may indicate a reliability of the storage cells. The storage capacity recovery module 318, in one example, may measure a T-erase time for an erase block as it erases the block during a storage capacity recovery operation. The cell capacity module 314 may assign the lossiest storage cells (e.g., erase blocks) to SLC mode and the rest to TLC mode, or the like. Once a reliability of a TLC erase block falls below a reliability threshold, in one embodiment, the cell capacity module 314 may reassign the TLC erase block to MLC mode, to SLC mode, or the like, with fewer states and bits per storage cell.

In one embodiment, the logical-to-physical mapping module 316 is configured to maintain a logical-to-physical mapping structure mapping logical identifiers (e.g., LBAs)

to physical locations in the non-volatile memory media 122. One embodiment of a logical-to-physical mapping structure is described below with regard to FIG. 6. As described above, due to copyback and/or IDM procedures, in certain embodiments, the same, valid data may exist at two locations within the non-volatile memory media 122. The different locations may be in different types of storage cells (e.g., SLC storage cells and TLC storage cells).

The logical-to-physical mapping module 316, in one embodiment, cooperates with the copyback module 306 to track locations for data in the non-volatile memory media 122, before, during, and after copyback and/or IDM operations. The logical-to-physical mapping module 316, in certain embodiments, may maintain multiple mappings for the same data, a primary/before mapping to a location in a first/source set of storage cells and a secondary/after mapping to a location in a second/destination set of storage cells, or the like. In certain embodiments, the logical-to-physical mapping module 316 may store or maintain multiple mappings for the same logical address or logical address range within the same entry within the logical-to-physical mapping structure (e.g., a primary mapping to an SLC location and a secondary mapping to a TLC location). In other embodiments, the logical-to-physical mapping module 316 may store or maintain different mappings for the same logical address or logical address range in different entries in a logical-to-physical mapping structure. The logical-to-physical mapping module 316 may cooperate with the read module 310 so that read requests are serviced using the primary mapping (e.g., a mapping to data in SLC storage cells), even after the data has been copied back to the second/destination set of storage cells, which may have slower access times, lower reliability, or the like than the first/source set of storage cells.

The logical-to-physical mapping module 316, in one embodiment, may be configured to update, remove, or replace a logical-to-physical mapping for a location of the data in the first/source set of non-volatile storage cells in response to copying or moving the data to the second/destination set of non-volatile storage cells, without verification. In a further embodiment, the logical-to-physical mapping module 316 may cooperate with the copyback module 306 to verify storage of and/or data integrity of data in the second/destination set of non-volatile storage cells prior to updating, removing, or replacing the mapping to the first/source set of non-volatile storage cells, by reading the data from the second/destination set of non-volatile storage cells, by receiving a completion indicator or confirmation from the non-volatile memory media 122, performing error correction on the data, or the like, as described above. The logical-to-physical mapping module 316 may cooperate with the storage capacity recovery module 318 to erase and recover storage capacity of the first/source set of storage cells once the logical-to-physical mapping module 316 has removed the mapping to the first/source set of storage cells.

The logical-to-physical mapping module 316, in certain embodiments, may delay updating, removing, or replacing the mapping to the first/source set of non-volatile storage cells until a predefined trigger is satisfied. For example, the logical-to-physical mapping module 316 may wait until the storage capacity recovery module 318 has selected the first/source set of storage cells for a storage capacity recovery operation, until an available, un-used capacity of the non-volatile memory device 120 has fallen below a capacity threshold, until a read rate for data of the first/source set of storage cells falls below a frequent access threshold, or the like. By delaying removal of a mapping to data of the first/source set of storage cells, in one embodiment, the logical-to-physical mapping module 316 allows data to be accessed from the first/source set of storage cells for as long as possible, optimizing performance for the data.

The logical-to-physical mapping module 316, in certain embodiments, cooperates with the power-cut module 320 described below to ensure that the logical-to-physical mapping structure, logical-to-physical mappings, and associated data are accessible and recoverable after a power level for the non-volatile memory device 120 falls below a threshold (e.g., a shutdown, power-cut, restart, reboot, power loss, or the like). For example, in one embodiment, the logical-to-physical mapping module 316 updates the logical-to-physical mapping only after data of a copyback and/or IDM operation can be read and/or otherwise verified from the second/destination storage cells (e.g., one or more pages of a TLC erase block) and before the data has been erased from the first/source storage cells (e.g., one or more pages of a SLC erase block). In this manner, the logical-to-physical mapping module 316 may cooperate with the power-cut module 320 to prevent data loss due to partially filled erase blocks, because the first/source erase block (e.g., SLC erase block), in certain embodiments, is not erased until the second/destination erase block has been confirmed or verified as being completely filled.

As described above, the copyback module 306 may optimize the copyback and/or IDM process. The logical-to-physical mapping module 316 may optimize access to data in pages or erase blocks involved in a copyback and/or IDM operation. For example, if data on a page is being accessed with high frequency, the copyback module 306, in cooperation with the abort module 308 or the like, may abort or postpone the copyback and/or IDM operation and leave the data in the first/source set of storage cells (e.g., SLC storage cells), which may provide faster reads than the second/destination set of storage cells (e.g., TLC storage cells). As described above, in certain embodiments, if data on a page is being accessed with high frequency, the copyback module 306 may allow the copyback and/or IDM operation to continue, but may modify the copyback and/or IDM operation so that a copy of the data remains in the first/source set of storage cells, at least until the high frequency of accesses declines or the like.

The logical-to-physical mapping module 316, in one embodiment, may store metadata in the logical-to-physical mapping structure, from the data factor module 322 or the like, indicating one or more data factors or other attributes for the associated data, allowing the refresh module 304 to determine whether to refresh data of a copyback and/or IDM operation, allowing the copyback module 306 to determine whether to perform a copyback and/or IDM operation for data, or the like. For example, the logical-to-physical mapping module 316 may include metadata in each logical-to-physical mapping entry indicating a quality-of-service or other priority for the associated data, an access frequency or frequency count (e.g., a read count, a write count, or the like) for the data, or the like. As described above, if data of the first/source set of storage cells (e.g., a SLC erase block) has a high QoS level, the copyback module 306 may determine not to move the data using a copyback and/or IDM operation, to copy the data to the second/destination set of storage cells (e.g., TLC storage cells) but also to let the data remain, at least temporarily, in the first/source set of storage cells to provide higher read performance.

In one embodiment, the storage capacity recovery module 318 cooperates with the logical-to-physical mapping module 316 and/or the copyback module 306 to erase and recover storage capacity of a first/source set of storage cells after a copyback and/or IDM operation has successfully completed for data of the first/source set of storage cells (e.g., a SLC erase block), which may be referred to as garbage collection. The storage capacity recovery module 318, in one embodiment, may be configured to recover a storage capacity of a first/source set of non-volatile storage cells in response to verifying storage of the data in a second/destination set of non-volatile storage cells, after a copyback and/or IDM operation, by reading the data, comparing the data to the data in the first/source set of storage cells, receiving confirmation from the non-volatile memory media 122, or the like. The storage capacity recovery module 318, in one embodiment, may verify storage of the data in response to a read request for the data, in cooperation with the read module 310 servicing the read request form a second/destination set of storage cells or the like, so that the verification adds little or no overhead, since the data has already been read.

In certain embodiments, the storage capacity recovery module 318 may delay recovering storage capacity for one or more erase blocks of the first/source set of storage cells, after the copyback module 306 has copied data from the erase blocks. The storage capacity recovery module 318, in certain embodiments, may selectively determine when to perform a storage capacity recovery operation for a first/source erase block for which the copyback module 306 has already performed a copyback and/or IDM operation based on one or more data factors or other attributes for the data of the erase block. For example, the storage capacity recovery module 318 may select an erase block of source (e.g., SLC) storage cells for storage capacity recovery with a lowest quality-of-service or priority level, with a lowest read frequency, with a highest write frequency (e.g., likely to be invalidated by a subsequent write), with a longest retention time, with a highest error rate (e.g., RBER, UBER), or the like. In one embodiment, the storage capacity recovery module 318 may wait to recover a storage capacity of a first/source set of storage cells (e.g., a SLC erase block) until an access rate such as a read rate for the data of the storage cells fails to satisfy a predefined access threshold. The storage capacity recovery module 318, in certain embodiments, may wait to recover a storage capacity of a first/source set of storage cells until a storage capacity threshold for the non-volatile memory device 120 is satisfied (e.g., the device 120 is full, approaching being full, or the like and storage capacity recovery is needed). In a further embodiment, the storage capacity recovery module 318 may select an erase block for a storage capacity recovery operation based on a combination of multiple data factors or other attributes, such as a weighted average, a combination of scaled data factors or attributes, a decision tree, or the like.

In one embodiment, the power-cut module 320 manages consistency of data after a power-cut event for the non-volatile memory media 122, the non-volatile memory device 120, the computing device 110, or the like. The memory device 120, in certain embodiments, includes a write pipeline 240 and a read pipeline 241 as described above. The write pipeline 240 may perform certain operations on data as the data is transferred from the storage client 116 into the non-volatile memory media 122. These operations may include, for example, error correction code (ECC) generation, encryption, compression, or the like. The read pipeline 241 may perform similar and potentially inverse operations on data that is being read out of non-volatile memory media 122 and sent to the storage client 116.

The memory device 120, in certain embodiments, also includes a secondary power supply that provides power in the event of a complete or partial power disruption resulting in the memory device 120 not receiving enough electrical power over the primary power connection 125. A power disruption is any event that unexpectedly causes the memory device 120 to stop receiving power over the primary power connection 125, or causes a significant reduction in the power received by the memory device 120 over the primary power connection 125. A significant reduction in power, in one embodiment, includes the power falling below a predefined threshold. The predefined threshold, in a further embodiment, may be selected to allow for normal fluctuations in the level of power from the primary power connection 125. For example, the power to a building where the storage client 116 and the memory device 120 are located may fail or go out. A user action (such as improperly shutting down the computing device 110 providing power to the memory device 120), a failure in the primary power connection 125, or a failure in the primary power supply may cause the memory device 120 to stop receiving power. Various types of power disruptions may cause unexpected power loss for the memory device 120.

The secondary power supply may include one or more batteries, one or more capacitors, a bank of capacitors, a separate connection to a power supply, or the like. In one embodiment, the secondary power supply provides power to the memory device 120 for at least a power hold-up time during a power disruption or other reduction in power from the primary power connection 125. The secondary power supply, in a further embodiment, may provide a power hold-up time long enough to enable the memory device 120 to flush certain data that is not in non-volatile memory media 122 into the non-volatile memory media 122.

In one embodiment, the secondary power supply is part of an electrical circuit that automatically provides power to the memory device 120 upon a partial or complete loss of power from the primary power connection 125. Similarly, the memory device 120 may be configured to automatically accept or receive electric power from the secondary power supply during a partial or complete power loss. For example, in one embodiment, the secondary power supply may be electrically coupled to the memory device 120 in parallel with the primary power connection 125, so that the primary power connection 125 charges the secondary power supply during normal operation and the secondary power supply automatically provides power to the memory device 120 in response to a power loss. In one embodiment, the memory device 120 further includes a diode or other reverse current protection between the secondary power supply and the primary power connection 125, to prevent current from the secondary power supply from reaching the primary power connection 125. In another embodiment, the power-cut module 320 may enable or connect the secondary power supply to the memory device 120 using a switch or the like in response to reduced power from the primary power connection 125.

In addition, in certain embodiments, some data within the write pipeline 240 may be corrupted as a result of the power disruption. A power disruption may include a power failure as well as unexpected changes in power levels supplied. The unexpected changes in power levels may place data that is in the memory device 120, but not yet in non-volatile memory media 122, at risk. Data corruption may begin to occur before the power-cut module 320 is even aware (or notified) that there has been a disruption in power.

In certain embodiments, the power-cut module 320 is implemented as part of the non-volatile memory controller 124, the non-volatile memory media controller 126, or the like. The power-cut module 320 may be, for instance, a hardware driver (e.g., the SML 130) or be implemented in firmware for the memory device 120 (e.g., the non-volatile memory media controller 126). In other embodiments, the power-cut module 320 may be implemented partially in a driver and partially in the non-volatile memory media controller 126, or the like. In one embodiment, at least a portion of the power-cut module 320 is implemented on the memory device 120, as part of the non-volatile memory media controller 126, or the like, so that the power-cut module 320 continues to function during a partial or complete power loss using power from the secondary power supply, even if the storage client 116 is no longer functioning.

In one embodiment, the power-cut module 320 initiates a power loss mode in the memory device 120 in response to a reduction in power from the primary power connection 125. During the power loss mode, the power-cut module 320, in one embodiment flushes data that is in the memory device 120 that is not yet stored in non-volatile memory media 122 into the non-volatile memory media 122. In particular embodiments, the power-cut module 320 may flush the data that has been acknowledged and is in the memory device 120 that is not yet stored in non-volatile memory media 122 into the non-volatile memory media 122. In certain embodiments, the power-cut module 320 may adjust execution of data operations on the memory device 120 to ensure that essential operations complete before the secondary power supply loses sufficient power to complete the essential operations during the power hold-up time that the secondary power supply provides.

In certain embodiments, the essential operations comprise those operations for data that has been acknowledged as having been stored, such as acknowledged write operations. In other embodiments, the essential operations comprise those operations for data that has been acknowledged as having been stored and erased. In other embodiments, the essential operations comprise those operations for data that have been acknowledged as having been stored, read, and erased. The power-cut module 320 may also terminate non-essential operations to ensure that those non-essential operations do not consume power unnecessarily and/or do not block essential operations from executing; for example, the power-cut module 320 may terminate erase operations, read operations, unacknowledged write operations, and the like.

In one embodiment, terminating non-essential operations preserves power from the secondary power supply, allowing the secondary power supply to provide the power hold-up time. In a further embodiment, the power-cut module 320 quiesces or otherwise shuts down operation of one or more subcomponents of the memory device 120 during the power loss mode to conserve power from the secondary power supply. For example, in various embodiments, the power-cut module 320 may quiesce operation of the read pipeline 241, a read direct memory access (DMA) engine, and/or other subcomponents of the memory device 120 that are associated with non-essential operations.

The power-cut module 320 may also be responsible for determining what data was corrupted by the power disruption, preventing the corrupt data from being stored in non-volatile memory media 122, and ensuring that the storage client 116 is aware that the corrupted data was never actually stored on the memory device 120. This prevents corruption of data in the memory device 120 resulting from the power disruption.

In one embodiment, since data of a copyback and/or IDM operation is already stored in the first/source set of storage cells, the power-cut module 320 considers an in-process copyback and/or IDM operation as non-essential, and cooperates with the abort module 308 to abort in-process copyback and/or IDM operations in response to the power level failing to satisfy a threshold, during a power loss mode or the like. Further, programming certain types of storage cells, such as TLC storage cells, may require that the entire erase block be programmed, or else the partially filled erase block may be unusable or corrupted, potentially causing data loss. The power-cut module 320 may cooperate with the logical-to-physical mapping module 316 to ensure that data of an aborted copyback and/or IDM operation remains available in the first/source set of storage cells after a power failure, and that the logical-to-physical mapping structure does not contain any mappings to data copied back to a partially filled erase block.

The power-cut module 320, in one embodiment, may cooperate with the storage capacity recovery module 318 to erase and recover the storage capacity of any partially filled erase blocks of the second/destination sets of storage cells (e.g., TLC erase blocks). The copyback module 306, in certain embodiments, may restart any aborted copyback and/or IDM operations after recovery from the power level failing, or the like. To facilitate recovery from a power failure, erasure of partially filled erase blocks, or the like, in certain embodiments, the power-cut module 320 may cooperate with the copyback module 306 to mark erase blocks of second/destination storage cells (e.g., TLC erase blocks) as filled in response to copyback and/or IDM operations filling the erase blocks. During recovery, the power-cut module 320 and/or the storage capacity recovery module 318 may perform storage capacity recovery operations for any erase blocks of second/destination storage cells that are not marked as filled. In a further embodiment, the power-cut module 320 and/or the storage capacity recovery module 318 may perform a recovery scan of the non-volatile memory media 122 to locate partially filled erase blocks of second/destination storage cells, even in embodiments where partially filled erase blocks are not marked.

In one embodiment, the data factor module 322 is configured to determine one or more data factors or other attributes for data of first/source sets of non-volatile storage cells (e.g., SLC erase blocks), with a lower number of bits represented per cell than second/destination sets of non-volatile storage cells (e.g., TLC erase blocks). In certain embodiments, the data factor module 322 may maintain metadata indicating the data factors or other attributes that the data factor module 322 has determined. The data factor module 322 may cooperate with the logical-to-physical mapping module 316 to store metadata indicating one or more data factors or other attributes associated with data in the logical-to-physical mapping structure, may store indicators of one or more data factors or other attributes with the associated data in the non-volatile memory media 122, and/or may maintain other metadata indicating one or more data factors or other attributes. As described above, in various embodiments, the refresh module 304 may determine which data to refresh based on one or more data factors or other attributes from the data factor module 322, the copyback module 306 may determine which data to move or copyback based on one or more data factors or other attributes from the data factor module 322, the storage capacity recovery module 318 may select erase blocks for storage capacity recovery or garbage collection based on one or more data factors or other attributes from the data factor module 322, or the like.

In one embodiment, an attribute associated with data (e.g., a data factor) comprises a characteristic or aspect associated with stored data, with non-volatile storage cells storing data, or the like or an indicator or flag associated with such a characteristic or aspect. An attribute associated with data (e.g., a data factor), in certain embodiments, may comprise an indicator of a likelihood that associated data has one or more data errors. An attribute associated with data (e.g., a data factor), in certain embodiments, may comprise an indicator of a number of data errors for the associated data. An attribute associated with data (e.g., a data factor), in various embodiments, may include one or more of a quality-of-service level or other priority for the data, an error rate for the data such as a raw bit error rate (RBER) or uncorrectable bit error rate (UBER), an age for the data (e.g., a retention time or time since written), a program/erase cycle count for the first/source set of non-volatile storage cells, a write frequency for the data, a read frequency for the data, a capacity threshold being satisfied for the first/source set of non-volatile storage cells, or the like.

In certain embodiments, a data factor or other attribute associated with data may include a flag or other indicator associated with data, indicating that the data satisfies a data factor threshold, such as a quality-of-service or other priority threshold, an error rate threshold, an age threshold, a program/erase count threshold, a write frequency threshold, a read frequency threshold, a capacity threshold, or the like. For example, the data factor module 322 may set or store a flag or other indicator for data periodically, in response to a storage request for the data, in response to a background scan of the data, in response to a storage capacity recovery event for an erase block or other set of storage cells storing the data, or the like. In one embodiment, the refresh module 304 may determine whether or not to refresh data based on a flag or other indicator that the data factor module 322 has set for the data (e.g., a data factor). The copyback module 306, in certain embodiments, may determine whether or not to store data in a second/destination set of storage cells based on a flag or other indicator that the data factor module 322 has set for the data (e.g., a data factor). As described below, the data factor module 322 may store or maintain metadata for one or more data factors or other attributes, such as one or more flags or other indicators for the data factors, in entries of a logical-to-physical mapping structure, with data in the non-volatile memory media 122, in a separate data structure, or the like.

The data factor module 322 may determine, monitor, and/or track data factors or other attributes for one or more granularities of data, such as per ECC code word or chunk, per logical or physical page, per logical or physical erase block, per range of LBAs in the logical-to-physical mapping structure, or the like. The data factor module 322, in one embodiment, operates a background process that scans the non-volatile memory media 122 to determine data factors or other attributes, reading the data and processing it to determine the data factors or attributes. In a further embodiment, the data factor module 322 may determine data factors or attributes for erase blocks that the storage capacity recovery module 318 recovers. In another embodiment, the data factor module 322 may determine data factors or attributes as the buffer module 302 and/or the read module 310 receive and satisfy storage requests, such as read requests and write requests, for the data. In certain embodiments, the data factor module 322 may use a predetermined model or characterization associated with a set of storage cells to predictively determine data factors or attributes, without necessarily reading or otherwise processing the data from the storage cells.

Figure 4:
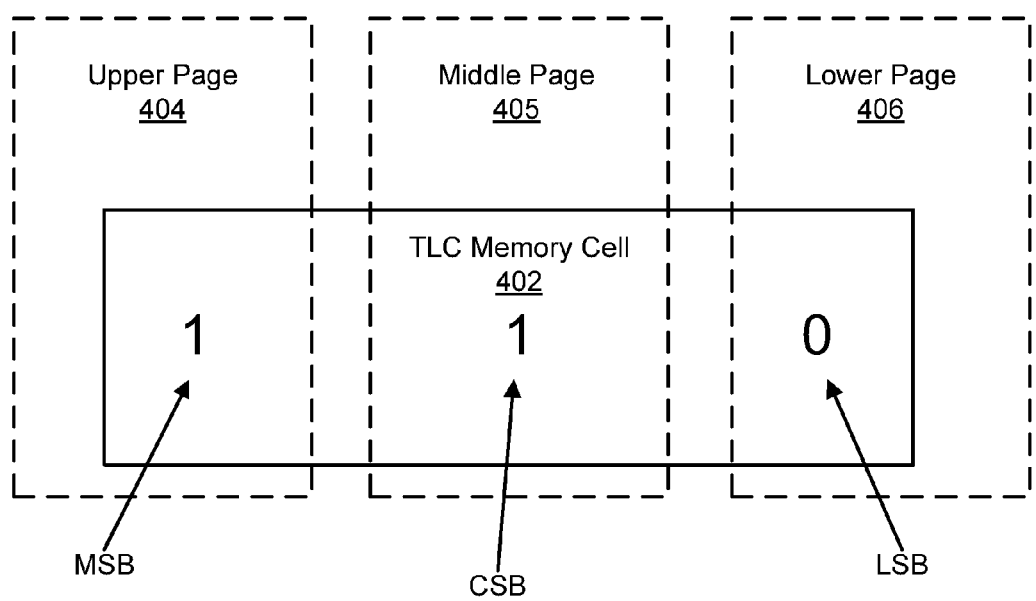
FIG. 4 is a schematic block diagram illustrating one embodiment of a triple level memory cell.

FIG. 4 depicts one representation of a triple level memory cell 402 in a memory device 120. The triple level memory cell 402 is a cell that has $2^n$ possible states, where n is equal to the number of bits per cell. For example, a triple level memory cell 402 such as the one shown in FIG. 4 may store three bits of information, and accordingly have eight possible states or abodes, as discussed in greater detail below. In other embodiments, a memory cell 402 may store two bits of information, and accordingly have eight possible states or abodes; may store four bits of information, and accordingly have thirty-two possible states or abodes; or the like.

The triple level memory cell 402 stores at least a most significant bit (MSB), a central significant bit (CSB), and a least significant bit (LSB). In certain embodiments, as shown in FIG. 4, the MSB, CSB, and the LSB, though part of the same physical triple level memory cell 402, may be assigned to different pages of the media 122. In certain embodiments, a plurality of the triple level memory cells 402 are organized on the non-volatile memory media 122 (such as NAND flash for example) as a page or page tuple. In certain non-volatile memory media 122 comprising a plurality of the triple level memory cells 402 a page is the smallest unit that can be written to the media 122. In such embodiments, the triple level memory cell 402 may be associated with a page tuple, as described above that includes the upper page 404, the middle page 405, and the lower page 406. The upper page 404 is associated with the MSB, the middle page 405 is associated with the CSB, and the lower page 406 is associated with the LSB. In this manner, the upper page 404, the middle page 405, and the lower page 406 may be associated with or stored by the same, common set of memory cells 402 of the non-volatile memory media 122.

Thus, the MSB, the CSB, and the LSB in the same triple level memory cell 402 may have different addresses in the memory device 120. In certain embodiments, the upper page 404 includes the MSBs of a plurality of triple level memory cells 402, the middle page 405 includes the CSBs of a plurality of triple level memory cells 402, and the lower page 406 includes the LSBs of the same triple level memory cells 402. Writes directed to the upper page 404 may therefore cause changes only in the MSBs of the associated triple level memory cells 402, while writes directed to the lower page 406 cause changes only in the LSBs of the associated triple level memory cells 402, and so on for writes to the middle page 405. For triple level memory cells 402 such as NAND flash, writes directed to an upper page 404, a middle page 405, or a lower page 406 may cause changes to only certain of the associated triple level memory cells 402, since an erase operation puts the triple level memory cells 402 in a first logic value state, and the write operation or program operation only changes certain triple level memory cells 402 of a page to the opposite logic value state. Similarly, reads of data stored in the upper page 404 cause reads of the MSBs of multiple triple level memory cells 402, reads of data stored in the middle page 405 cause read of the CSBs of multiple triple level memory cells 402, and reads of data stored in the lower page 406 cause reads of the LSBs of multiple triple level memory cells 402.

In certain embodiments, the data bits are read in response to requests for data that has been stored on the storage device 120. Such a request may be referenced as a first read operation. In certain embodiments, the first read operation is directed to the lower page 406 such that only the LSB is returned from the triple level memory cell 402. For example, a storage client 116 (e.g., a file system software application, operating system application, database management systems software application, a client computer, a client device, or the like) may store data on a storage device 120. In this example, when the storage client 116 sends a write request, the data is written exclusively to the lower page 406 and/or the middle page 405. As a result, the LSBs and/or the CSBs in the various triple level memory cells 402 are changed, but the MSBs are not changed by the write. Similarly, in this example, when the storage client 116 reads data, the read is directed or addressed to the lower page 406 and/or the middle page 405 and only the LSBs and/or CSBs are read.

Figure 5:
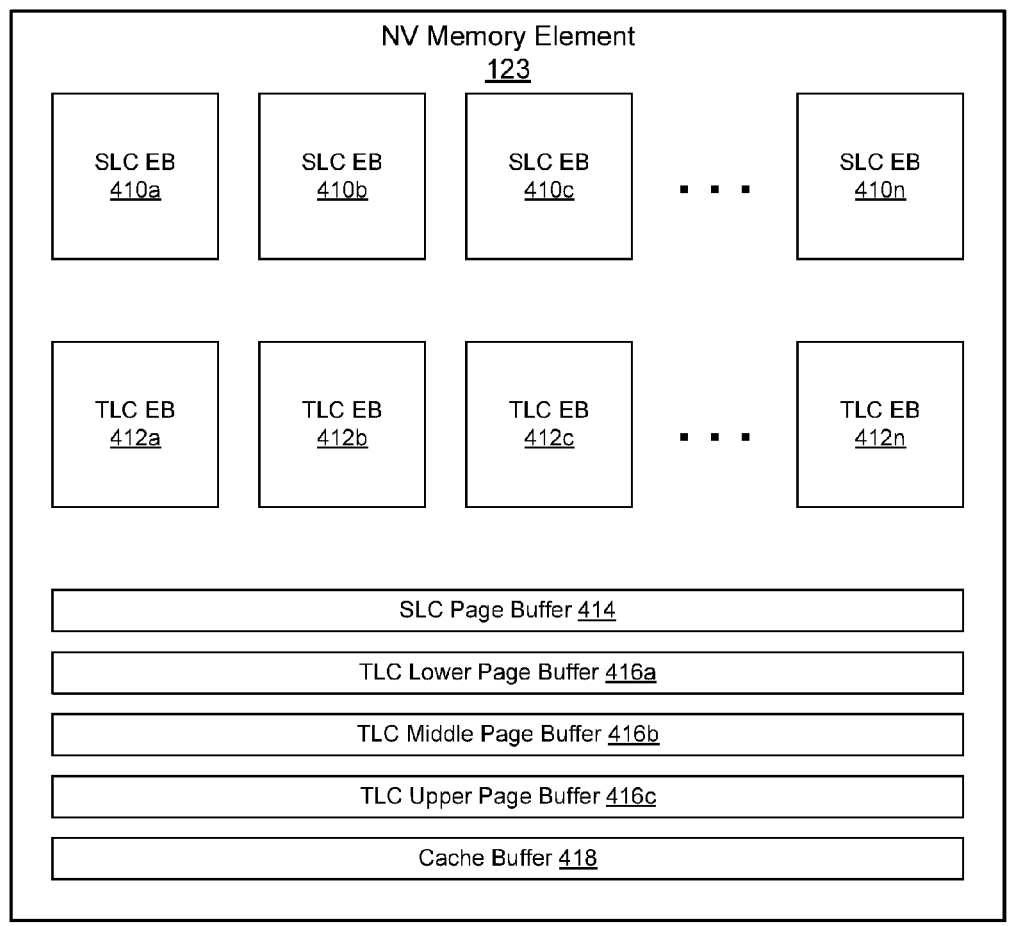
FIG. 5 is a schematic block diagram illustrating one embodiment of a non-volatile memory element.

FIG. 5 depicts one embodiment of a non-volatile memory element 123. In the depicted embodiment, the non-volatile memory element 123 includes one or more SLC erase blocks 410a-n, one or more TLC erase blocks 412a-n, an SLC page buffer 414, a TLC lower page buffer 416a, a TLC middle page buffer 416b, a TLC upper page buffer 416c, and a cache buffer 418.

In one embodiment, the buffer module 302 writes data of write requests to the SLC page buffer 414, from which the data is programmed to the one or more SLC erase blocks 410a-n. As the buffer module 302 fills the SLC erase blocks 410a-c with data, the copyback module 306 determines whether or not to internally copy or move the data back to a TLC erase block 412, based on one or more data factors or attributes for the data from the data factor module 322 or the like. If the copyback module 306 determines to internally copy or move the data from the SLC erase blocks 410a-c back to a TLC erase block 412, the copyback module 306 may load the data, page by page, into the TLC page buffers 416.

The refresh module 304 may determine whether or not to perform a refresh operation on the data, a portion of the data, or the like that the copyback module 306 has loaded into the TLC page buffers 416, and may return refreshed data to the TLC page buffers 416, leave un-refreshed data in the TLC page buffers 416, or the like. In certain embodiments, the copyback module 306 writes or programs three pages from the SLC erase blocks 410a-n to a TLC erase block 412 at a time, from the TLC page buffers 416a-c. Once the copyback and/or IDM operation has completed, the data may remain in the SLC erase blocks 410a-n for use by the read module 310, until the storage capacity recovery module 318 determines to erase the data at a later time.

Figure 6:
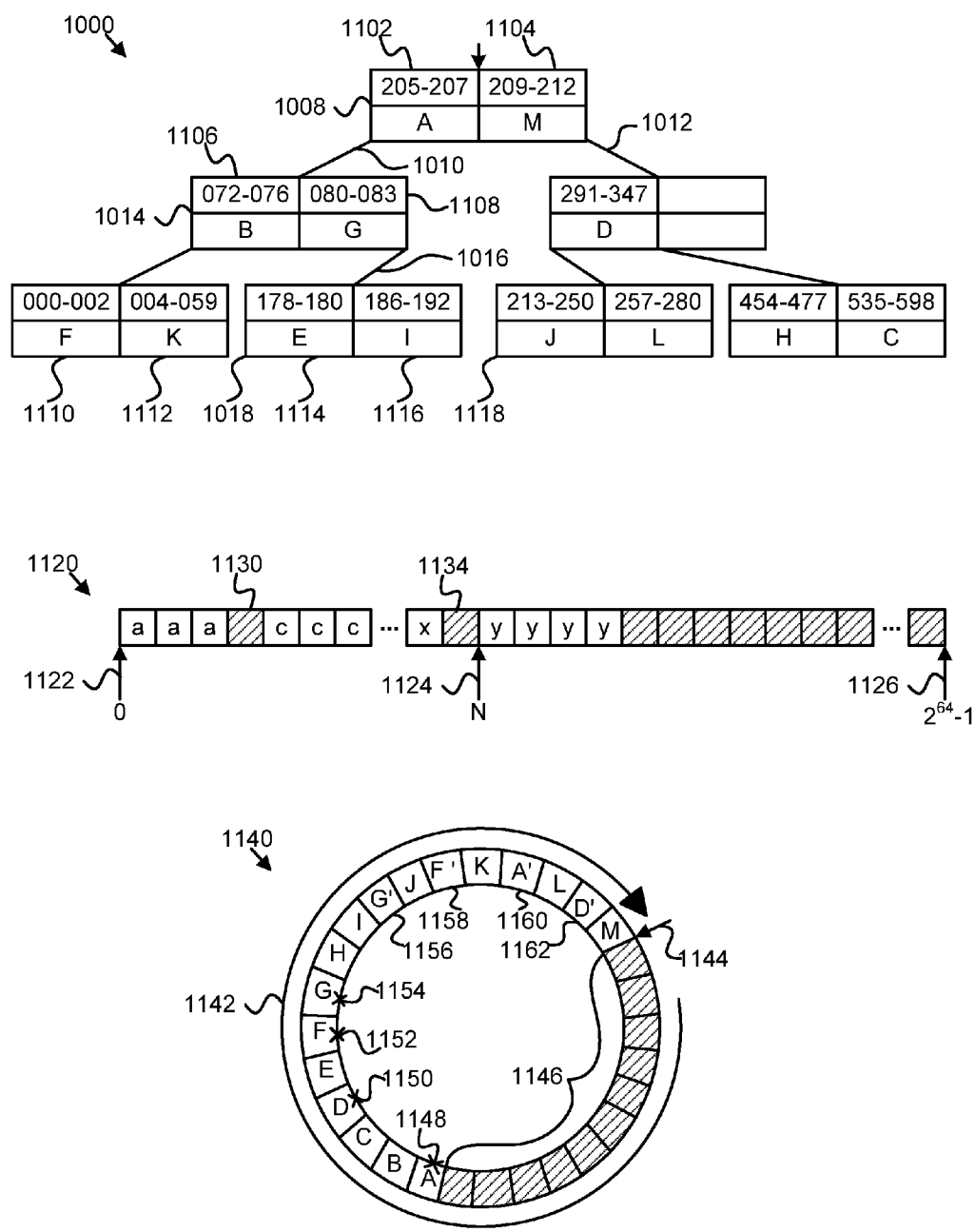
FIG. 6 is a schematic block diagram illustrating one embodiment of a mapping structure, a logical address space, and a log-based writing structure.

FIG. 6 depicts one embodiment of a mapping structure 1000, a logical address space 1120, and a sequential, log-based, append-only writing structure 1140. The mapping structure 1000, in one embodiment, is maintained by the logical-to-physical mapping module 316 of the non-volatile memory controller 124 to map LBAs or other logical addresses to physical locations on the non-volatile memory media 122. The mapping structure 1000, in the depicted embodiment, is a B-tree with several entries. In the depicted embodiment, the nodes of the mapping structure 1000 include direct references to physical locations in the non-volatile memory device 120. In other embodiments, the mapping structure 1000 may include links that map to entries in a reverse map, or the like. The mapping structure 1000, in various embodiments, may be used either with or without a reverse map. In other embodiments, the references in the mapping structure 1000 may include alpha-numerical characters, hexadecimal characters, pointers, links, and the like.

The mapping structure 1000, in the depicted embodiment, includes a plurality of nodes. Each node, in the depicted embodiment, is capable of storing two entries. In other embodiments, each node may be capable of storing a greater number of entries, the number of entries at each level may change as the mapping structure 1000 grows or shrinks through use, or the like.

Each entry, in the depicted embodiment, maps a variable length range of LBAs of the non-volatile memory device 120 to a physical location in the storage media 122 for the non-volatile memory device 120. Further, while variable length ranges of LBAs, in the depicted embodiment, are represented by a starting address and an ending address, in other embodiments, a variable length range of LBAs may be represented by a starting address and a length, or the like. In another embodiment, instead of storing variable length ranges of LBAs, the mapping structure 1000 may store a single LBA or other logical address in an entry as a starting address for a data value and/or for associated metadata.

In one embodiment, the capital letters 'A' through 'M' represent a logical or physical erase block in the physical storage media 122 of the non-volatile memory device 120 that stores the data of the corresponding range of LBAs. In other embodiments, the capital letters may represent other physical addresses or locations of the non-volatile memory device 120. In the depicted embodiment, the capital letters 'A' through 'M' are also depicted in the log-based writing structure 1140 which represents the physical storage media 122 of the non-volatile memory device 120.

In the depicted embodiment, membership in the mapping structure 1000 denotes membership (or storage) in the non-volatile memory device 120. In another embodiment, an entry may further include an indicator of whether the non-volatile memory device 120 stores data corresponding to a logical block within the range of LBAs, data of a reverse map, and/or other data.

In the depicted embodiment, the root node 1008 includes entries 1102, 1104 with noncontiguous ranges of LBAs. A "hole" exists at LBA "208" between the two entries 1102, 1104 of the root node. In one embodiment, a "hole" indicates that the non-volatile memory device 120 does not store data corresponding to one or more LBAs corresponding to the "hole." In one embodiment, the non-volatile memory device 120 supports block I/O requests (read, write, trim, etc.) with multiple contiguous and/or noncontiguous ranges of LBAs (i.e. ranges that include one or more "holes" in them). A "hole," in one embodiment, may be the result of a single block I/O request with two or more noncontiguous ranges of LBAs. In a further embodiment, a "hole" may be the result of several different block I/O requests with LBA ranges bordering the "hole."

In the depicted embodiment, similar "holes" or noncontiguous ranges of LBAs exist between the entries 1106, 1108 of the node 1014, between the entries 1110, 1112 of the left child node of the node 1014, between entries 1114, 1116 of the node 1018, and between entries of the node 1118. In one embodiment, similar "holes" may also exist between entries in parent nodes and child nodes. For example, in the depicted embodiment, a "hole" of LBAs "060-071" exists between the left entry 1106 of the node 1014 and the right entry 1112 of the left child node of the node 1014.

The "hole" at LBA "003," in the depicted embodiment, can also be seen in the logical address space 1120 of the non-volatile memory device 120 at logical address "003" 1130. The hash marks at LBA "003" 1140 represent an empty location, or a location for which the non-volatile memory device 120 does not store data. The "hole" at LBA 1134 in the logical address space 1120, is due to one or more block I/O requests with noncontiguous ranges, a PTRIM or other deallocation command to the non-volatile memory device 120, or the like.

The logical address space 1120 of the non-volatile memory device 120, in the depicted embodiment, is larger than the physical storage capacity and corresponding storage device address space of the non-volatile memory device 120. In the depicted embodiment, the non-volatile memory device 120 has a 64 bit logical address space 1120 beginning at logical address "0" 1122 and extending to logical address "264-1" 1126. Because the storage device address space corresponds to only a subset of the logical address space 1120 of the non-volatile memory device 120, the rest of the logical address space 1120 may be restricted or used for other functions of the non-volatile memory device 120.

The sequential, log-based, append-only writing structure 1140, in the depicted embodiment, is a logical representation of the physical storage media 122 of the non-volatile memory device 120. In certain embodiments, the non-volatile memory device 120 stores data sequentially, appending data to the log-based writing structure 1140 at an append point 1144. The non-volatile memory device 120, in a further embodiment, uses a storage space recovery process, such as a storage capacity recovery module 318 or other storage space recovery module that re-uses non-volatile storage media 122 storing deallocated/unused logical blocks. Non-volatile storage media storing deallocated/unused logical blocks, in the depicted embodiment, is added to an available storage pool 1146 for the non-volatile memory device 120. By clearing invalid data from the non-volatile memory device 120, as described above, and adding the physical storage capacity corresponding to the cleared data back to the available storage pool 1146, in one embodiment, the log-based writing structure 1140 is cyclic, ring-like, and has a theoretically infinite capacity.

In the depicted embodiment, the append point 1144 progresses around the log-based, append-only writing structure 1140 in a circular pattern 1142. In one embodiment, the circular pattern 1142 wear balances the non-volatile memory media 122, increasing a usable life of the non-volatile memory media 122. In the depicted embodiment, a storage capacity recovery module 318 or other storage capacity recovery process has marked several blocks 1148, 1150, 1152, 1154 as invalid, represented by an "X" marking on the blocks 1148, 1150, 1152, 1154. The storage capacity recovery module 318, in one embodiment, will recover the physical storage capacity of the invalid blocks 1148, 1150, 1152, 1154 and add the recovered capacity to the available storage pool 1146. In the depicted embodiment, modified versions of the blocks 1148, 1150, 1152, 1154 have been appended to the log-based writing structure 1140 as new blocks 1156, 1158, 1160, 1162 in a read, modify, write operation or the like, allowing the original blocks 1148, 1150, 1152, 1154 to be recovered.

FIG. 7 depicts one embodiment of a system for storing information in a storage device 120 that includes one or more triple level memory cells 402. In one embodiment, the system includes a driver 702, mapping logic module 704, hardware controller 706, and non-volatile memory media 122. In certain embodiments, these components are part of the storage device 120.

In one embodiment, the driver 702 receives write requests and read requests from one or more clients 116 directed at the non-volatile memory media 122. The requests typically include an address component, such as a page address, a logical block address, a filename and an offset, or the like. In certain embodiments, neither the upper pages 404, nor the middle pages 405, nor the lower pages 406 are exposed to the storage client 116. Instead, the driver 702 presents a set of logically contiguous block addresses, cluster identifiers, file identifiers, or object identifiers (referred to herein as logical block addresses) to the storage client 116.

The mapping logic module 704 may be software, hardware, or a combination thereof. In one embodiment, the physical media page addresses are contiguous and the mapping logic maps the physical media page addresses to an appropriate lower page 406, middle page 405, or upper page 404 based on the current operation mode of the storage device 120 and the wear condition of the triple level memory cells 402 of the storage device 120. In another embodiment, the driver 702 maps the logical block address directly to the appropriate address for the physical lower page 406.

The mapping logic module 704 may be software, hardware, or a combination thereof. In one embodiment, the mapping logic module 704 maps the physical page address to a page tuple of the storage device 120. As explained above, the page tuple may include a lower page 406 that is associated with the LSBs of the triple level memory cells 402 in the non-volatile memory media 122, a middle page 405 that is associated with the CSBs of the triple level memory cell 402, and an upper page 404 that is associated with the MSBs of the triple level memory cells 402.

The hardware controller 706 receives the write and/or read requests from the mapping logic module 704 and executes them such that the data is stored on the non-volatile memory media 122 as directed by the instructions given by the mapping logic module 704. The hardware controller 706 may be hardware, firmware, software, or a combination thereof. In certain embodiments, the hardware controller 706 may comprise a field programmable gate array (FPGA), a processor, or an application specific integrated circuit (ASIC).

Figure 8A:
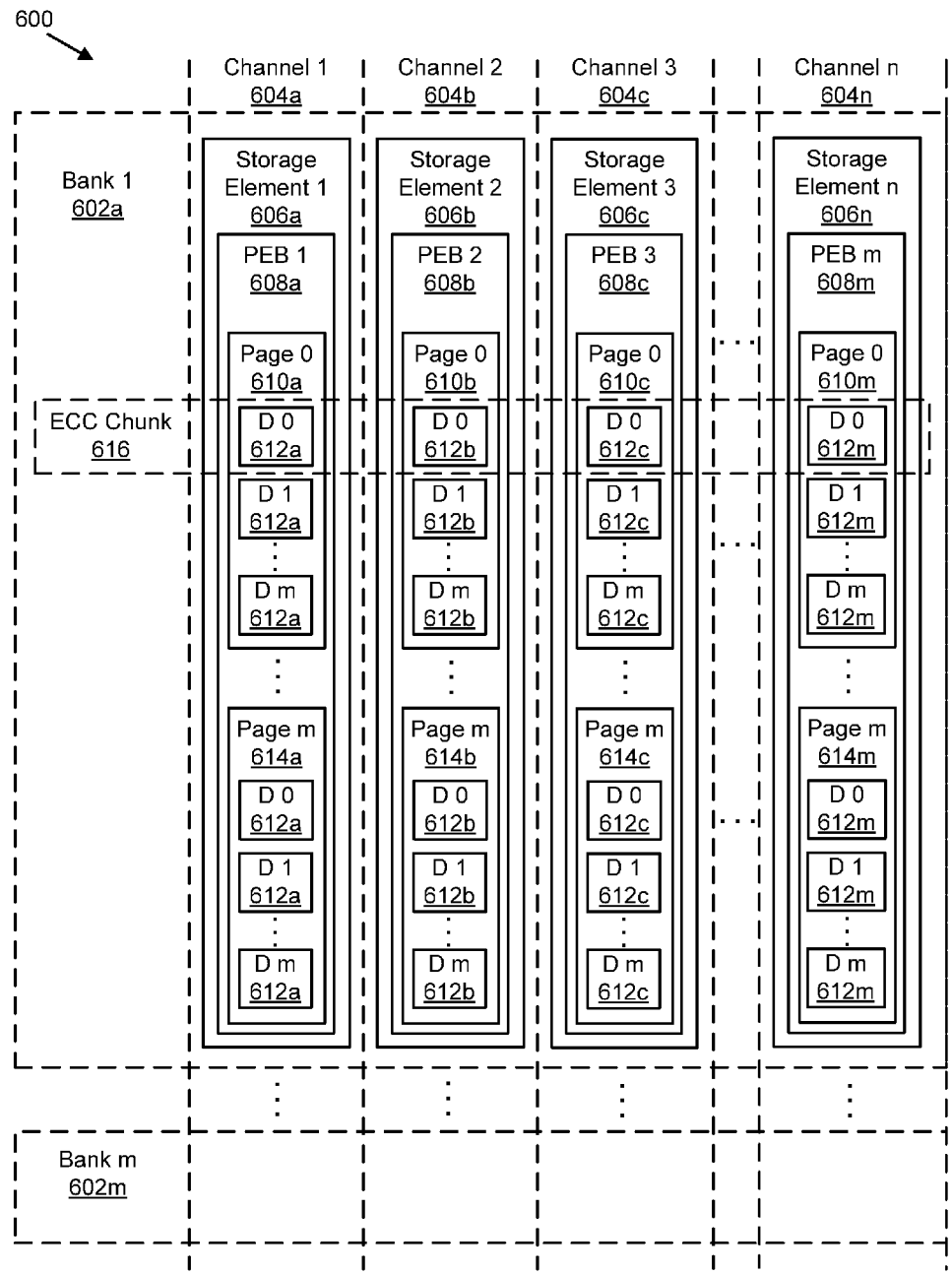
FIG. 8A is a schematic block diagram illustrating one embodiment of an array of storage elements of non-volatile memory media.

FIG. 8A is a schematic block diagram illustrating one embodiment of an array 600 of N number of storage elements 606. In the depicted embodiment, an ECC chunk 616 includes data 612 from several storage elements 606. In a further embodiment, ECC checkbits for the ECC chunk 616 are also stored across several storage elements 606.

The array 600 of storage elements 606, in one embodiment, includes N number of storage elements 606a, 606b, 606c, . . . 606n. Each storage element 606 may comprise a device, a chip, a portion of a chip, a die, a plane in a die, or the like. In the depicted embodiment, the storage elements 606a-n form a bank 602a. The array 600, in one embodiment, includes several banks 602a . . . 602m. The banks 602a-m, in the depicted embodiment, include several channels 604a, 604b, 604c, . . . , 604n. In one embodiment, a packet or data set is written across the several channels 604a-n and data is read separately from each channel 604a-n and reassembled into the packet. In another embodiment, an ECC chunk 616, packet, or data set is written across the several channels 604a-n and data is read in parallel from all the channels 604a-n. One read operation on a bank 602a may read a whole ECC chunk 616, packet, or data set or a portion of an ECC chunk 616, packet, or data set that is reassembled into a whole ECC chunk 616, packet, or data set. In the depicted embodiment, each channel includes at least one storage element 606 in each bank 602.

Furthermore, in one embodiment each storage element 606 includes a physical erase block or "PEB" 608. For example, storage element one 606a includes PEB one 608a. A physical erase block is typically an erase block located on one die, chip, or other storage element 606. Each PEB 608 includes m physical pages 610. For example, PEB one 608a includes page 0 610a ... page m 614a. Each physical page 610a stores a portion of data ("D 0, D 1, ..., D m") 612 and ECC checkbits distributed with the data 612. As described above, several pages 610 of the same storage element 606, the same PEB 608, or the like may share the same, common set of memory cells. For example, three pages 610 may be stored or encoded by abodes or program states of the same, common set of TLC memory cells.

In one embodiment, a group of PEBs (PEB 1 608a-PEB m 608m) forms a logical erase block ("LEB"). An LEB may span the array of N storage elements 600. In certain embodiments, an LEB is sized to fit within a bank 602a-m, with one PEB 608a-m from each storage element 606a-n or the like. In other embodiments, a LEB may span different banks 602a-m and may include one or more PEBs 608a-m from multiple banks 602a-m. Furthermore, in an embodiment, a logical page ("LP") spans a plurality of physical pages 610 in a row. In another embodiment a logical page spans N storage elements 606a-n.

In one embodiment, the ECC is a block code that is distributed with the data. Furthermore, the data and the ECC may not align with any particular physical hardware boundary. As a result, error correction with the ECC codes is not dependent on a particular hardware configuration. Therefore, the ECC and corresponding data may form an ECC chunk 616 and the ECC chunk 616 may be divided and stored on one or more of the N storage elements 606a-n. An ECC chunk 616 typically spans at least a portion of a plurality of physical pages 610 of a logical page where the data and ECC generated from the data 612a, 612b, ... 612m are spread across the N storage elements 606a-n. In one embodiment, a LP includes a plurality of ECC chunks 616. A physical page 610 may contain one or more data bytes of the ECC chunk 616. An ECC chunk 616 may span multiple rows within a physical page 610 and a physical page 610 may include a plurality of ECC chunks 616.

Because, in the depicted embodiment, the ECC checkbits for the ECC chunk 616 are distributed across several storage elements 606a-n and channels 604a-n, when a data error occurs due to a read voltage shift in one or more of the storage elements 606a-n, an ECC module or decoder may not be able to determine which storage elements 606 have an error that is correctable using audit bits of a predefined endurance data pattern. In one embodiment, the management module 150 determines which storage elements 606 or channels 604 have data bits that do not match an expected audit bit, to facilitate error correction by an ECC decoder or the like.

In one embodiment, the management module 150 and/or an ECC module or decoder determines that a data set has an error or an audit bit that deviates from a known or expected value, and the management module 150 determines from which storage element 606 the data set was read. For example, in one embodiment, the array 600 may have 24 channels 604, and 8 bytes may be read in parallel from 24 storage elements 606 of a single bank 602 during a read operation for a total of 192 bytes per read operation. Based on this information, the management module 150, in one embodiment, can determine from which storage element 606 a data set was read based on the position of an 8 byte data set within the 192 bytes. In one embodiment, the 192 bytes comprise the ECC chunk 616.

Figure 8B:
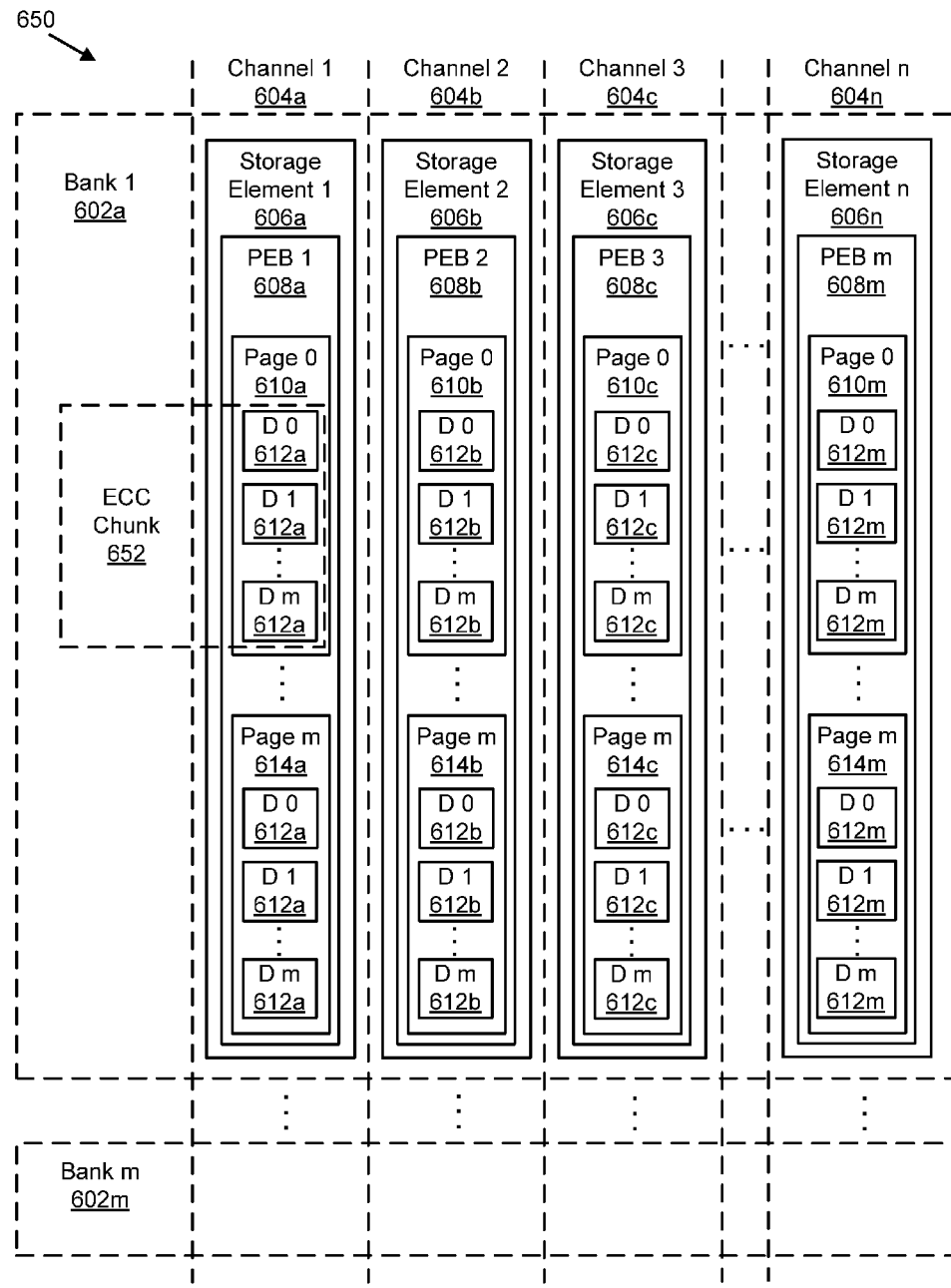
FIG. 8B is a schematic block diagram illustrating another embodiment of an array of storage elements of non-volatile memory media.

FIG. 8B is a schematic block diagram illustrating one embodiment of an array 650 of N storage elements 606. The array 650, in the depicted embodiment, is substantially similar to the array 600 of FIG. 10A, but with the ECC chunk 652 including data 612a in a single storage element 606a, instead of across several storage elements 606a-n. In one embodiment, ECC checkbits for the ECC chunk 652 are stored in the single storage element 606a. Because each storage element 606a-n or channel 604a-n has separate ECC checkbits, in one embodiment, an ECC module or decoder uses the separate ECC checkbits to determine in which storage elements 606a-n or channels 604a-n an error has occurred, and may cooperate with the management module 150 to use audit data as an extra layer of error protection should the ECC checkbits fail due to more errors than are correctable using the ECC checkbits alone.

Figures 9A, 9B:
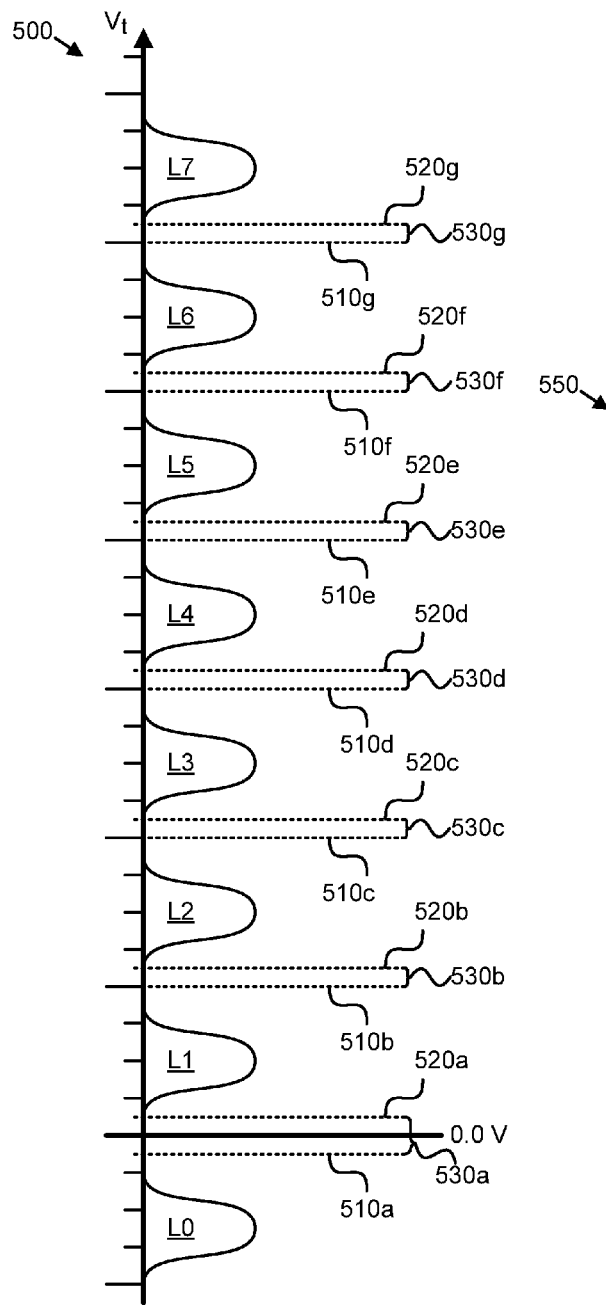
FIG. 9A is a graph illustrating one embodiment of states in cells of a non-volatile memory device.
FIG. 9B is a table illustrating one embodiment of an encoding of multiple bits by a cell of a non-volatile memory device.

FIG. 9A depicts a graph 500 of programming states or abodes for TLC memory cells of a non-volatile memory device 120. In the depicted embodiment, the non-volatile memory device 120 may be, for example, a TLC NAND flash memory device, and each cell has eight states, but various types of memory and numbers of states per cell may be used in other embodiments. In the depicted embodiment the data-encoding physical value of each cell is the read voltage level. The read voltage level, as used herein, refers to a voltage which causes the channel of a floating gate transistor conductive when a read voltage threshold ("Vt") is applied to the control gate. Data is stored in each cell by changing the amount of stored charge in the floating gate, which determines the read voltage level.

In the depicted embodiment, read voltage thresholds 510a-g divide the range of possible read voltage levels for a cell into states L0, L1, L2, L3, L4, L5, L6, and L7, where L0 is the erased state. In some embodiments, the erased state L0 may correspond to a negative read voltage level. If the read voltage level for a cell is below read voltage threshold 510a, the cell is in the L0 state. If the threshold voltage Vt for a cell is above read voltage threshold 510a, but below read voltage threshold 510b, the cell is in the L1 state, and so on. In response to a cell being programmed (or erased), the state of the cell may be determined by applying a verify threshold voltage 520a-g to the control gate, and sensing if the cell conducts, to determine if the read voltage level is above or below the applied verify threshold voltage 520a-g. By using different voltage thresholds for the read voltage thresholds 510a-g and the verify threshold voltages 520a-g, the read voltage module 312 forms guard bands 530a-g or separation distances between the cell states.

Although the graph 500 depicts a uniform distribution of cells among the states L0-L7, a bell-shaped distribution of read voltage levels is depicted in each state, because each cell in a particular state may have a different read voltage level within the range of read voltage levels for the state, read voltage levels may drift over time, or the like. Variations in the cells and in the programming process may cause variations in the read voltage levels when the cells are programmed. Also, the read voltage level of a cell may drift from its originally programmed voltage over time due to read disturbs, program disturbs, stress-induced leakage current, or the like. Although a symmetric bell-shaped distribution is shown, skewed distributions and other distributions are possible. Over time, the distributions may widen or skew as cells drift from their originally programmed read voltage levels, and such effects may increase over time with age.

If the distribution widens beyond the nearest read voltage threshold 510a-g, then some cells have drifted into an adjacent state, causing errors. In order to reduce this effect, the states L0-L7 are separated by guard bands 530a-g of a predefined separation distance. As described above, a guard band or separation distance comprises a range of a data-encoding physical property of a cell, such as a read voltage level or the like, which separates states of the cell. In the depicted embodiment, the guard bands are created when the cells are programmed, by verifying that each cell is programmed with a read voltage level above at least a verify voltage 520*a-g*, which is above or greater than the read voltage threshold Vt 510*a-g*, which defines the lower edge of the state. Thus, in the depicted embodiment, the first guard band 530*a* includes the voltage range 530*a* between read voltage threshold 510*a* and verify voltage threshold 520*a*, the second guard band is the voltage range 530*b* between read voltage threshold 510*b* and verify voltage threshold 520*b*, and so on.

In various embodiments, the states may be different distances from adjacent states, and the guard bands 530*a-g* may have different widths or sizes. For example, in the depicted embodiment, the separation 530*a* between the L0 and L1 states is greater than the separation 530*b-g* between other adjacent states, and the guard band 530*a* between L0 and L1 is correspondingly wider. Also, in the depicted embodiment, the read voltage thresholds 510*b-g* are at the midpoint between the most likely voltages for adjacent states, but in another embodiment, the read voltage thresholds 510 may be lower, and closer to the edge of the distribution of cells for the lower states, thus widening the guard bands and increasing the separation distances. Other arrangements of states, guard bands 530*a-g*, read voltage thresholds 510*a-g*, and verify voltage thresholds 520*a-g* are possible, and may be managed and adjusted by the read voltage module 312 to increase separation distances for a reduced level cell mode.

FIG. 9B depicts a table 550 illustrating one example encoding for the states L0-L7 of FIG. 11A. Because each cell in the depicted embodiment may be in one of eight different states, each cell encodes three different bits. The first bit is referred to as the most significant bit ("MSB"), the second bit is referred to as the central significant bit ("CSB"), and the third bit is referred to as the least significant bit ("LSB"). In the depicted embodiment, the encoding is a Gray code encoding, in which only one bit changes between adjacent states. In other embodiments, other encodings may be used.

In one embodiment, the level of reliability for a bit of a cell may be based on a number of transitions for the bit between adjacent states in an encoding of the cell. A transition 552 for a bit occurs between adjacent states if the value of the bit changes between those states. In the depicted encoding, it may be seen that the LSB has one transition 552, between the L3 and L4 states. The CSB has two transitions 552, between the L1 and L2 states and between the L5 and L6 states, and the MSB has four transitions 552. Because most errors occur between adjacent states, in certain embodiments, a bit experiences a higher risk of error in states near a transition 552 for that bit. Thus, because the LSB has one transition 552, in the depicted embodiment, the LSB provides a reliability level that is higher than provided by the CSB and the MSB. The CSB, with two transitions 552 in the depicted embodiment, provides a reliability level between the reliability levels provided by the LSB and the MSB. The MSB, with four transitions 552 in the depicted embodiment, provides a lower reliability level than those provided by the LSB and the CSB.

In another embodiment, the level of reliability for a bit of a cell may be based on and/or correlated to a size of a guard band 530*a-g* or separation distance between adjacent states, such as states with a transition 552 for the bit in an encoding of the cell. For example, in the depicted embodiment, the reliability level for the LSB may be increased by widening the guard band 530*d* at the transition 552 between the L3 and L4 states. Widening the guard band at one transition 552 may involve shifting the states and narrowing other guard bands, merging states, masking states, invalidating states, or the like, thus also affecting the reliability levels of other bits, such as the MSB and CSB.

Figure 10:
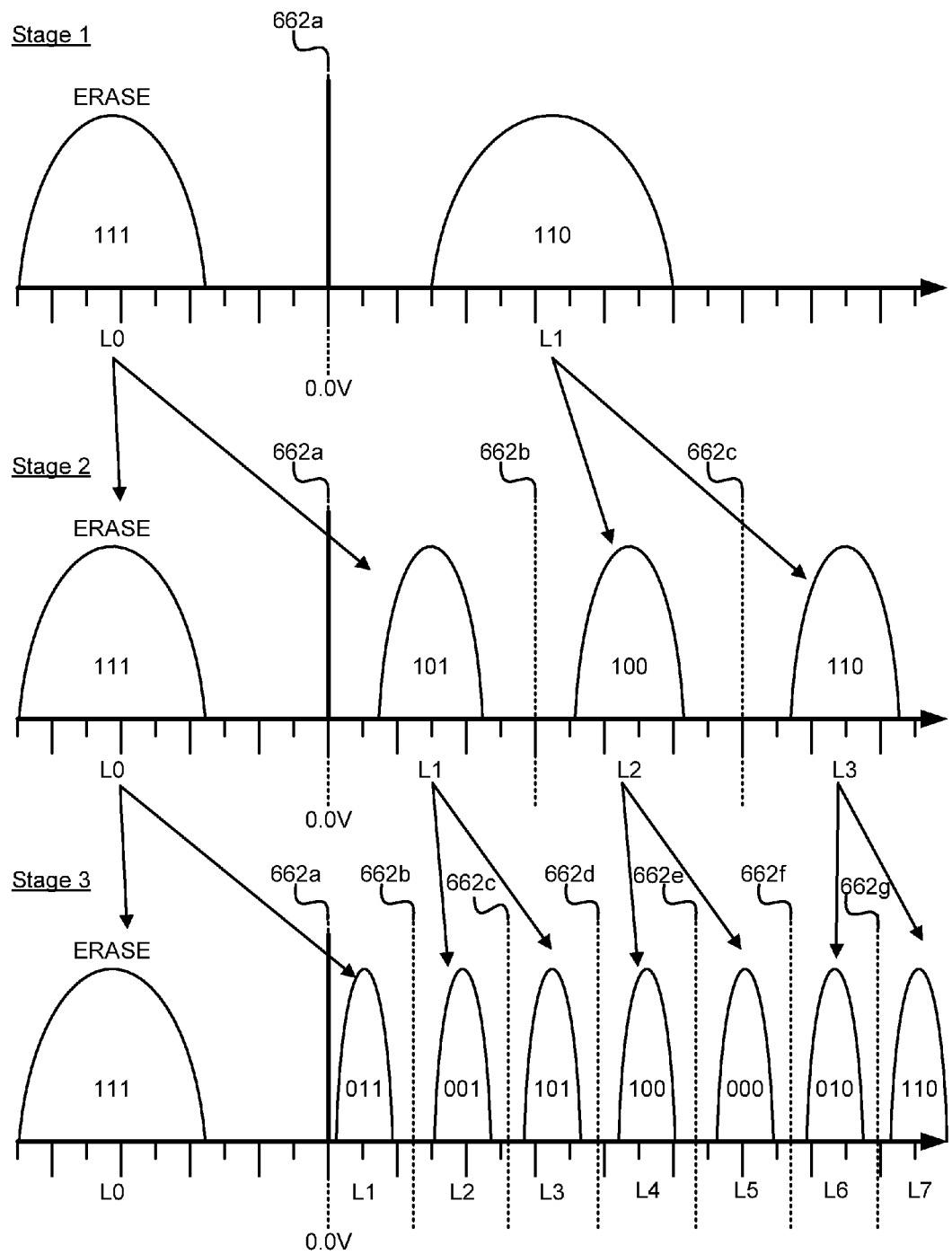
FIG. 10 is a series of graphs illustrating states of an encoding model for triple level cell memory.

FIG. 10 depicts one embodiment of boundary thresholds 662*a-g* for a set of triple level memory cells, such as MLC NAND flash storage cells, TLC NAND flash storage cells, or the like, with an example encoding or programming model. Any limitations inherent in the represented encoding model do not necessarily apply to all other encoding models, and the present disclosure should not be construed as inherently containing any such limitations. The abodes or program states, in the depicted embodiment, are encoded using a Gray code encoding model, with binary values for adjacent states differing by a single bit in the encoding. The depicted encoding of FIG. 10, may be one embodiment of programming stages used to program lower/LSB, middle/CSB, and upper/MSB pages using the encoding 550 and states 500 described above with regard to FIGS. 9A and 9B.

In the depicted embodiment, stage 1 comprises a program operation for the lower/LSB page, with a binary one for the lower/LSB page placing the memory cell into the L0 state or abode and a binary zero for the lower/LSB page placing the memory cell into the L1 state or abode. Stage 2 comprises a program operation for the middle/CSB page where, depending on the value of the lower/LSB bit programmed in stage 1 and the value of the middle/CSB bit being programmed, the memory cell may have one of four possible states or abodes. Stage 3 comprises a program operation for the upper/MSB page including eight possible states or abodes, depending on the values of the lower/LSB page programmed in stage 1, of the middle/CSB page programmed in stage 2, and of the upper/MSB page being programmed in stage 3.

Figure 12:
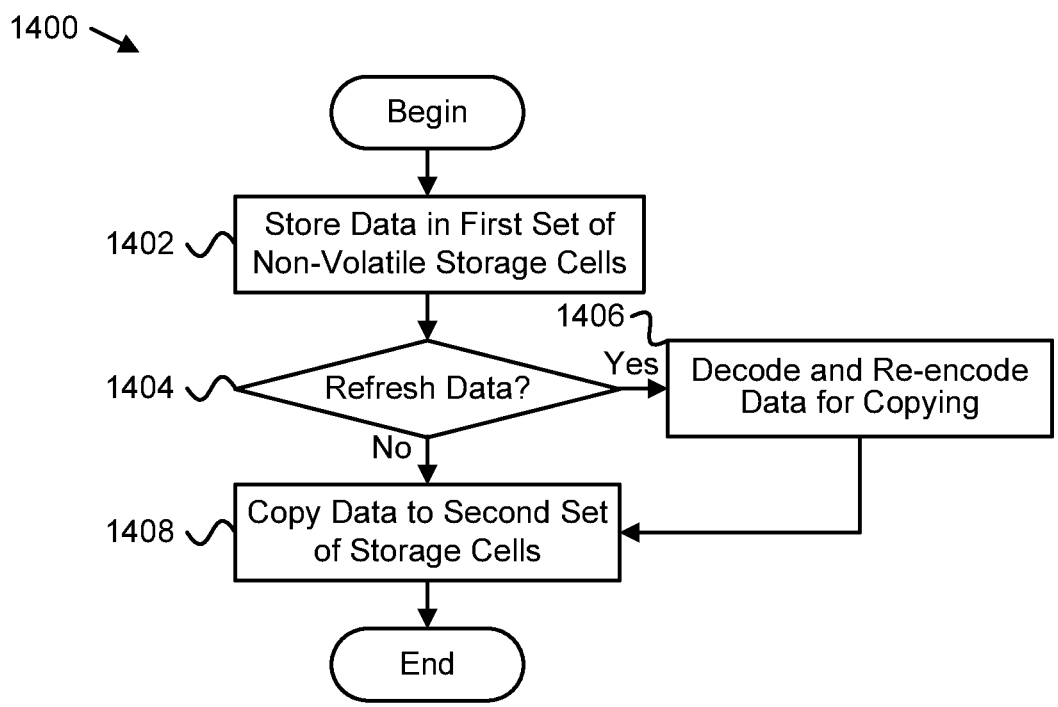
FIG. 12 is a schematic flow chart diagram illustrating another embodiment of a method for on die buffered (ODB) non-volatile memory management.

The stages, numbers of states or abodes per stage, and associated encoding may be specific to certain architectures, types, makes, or models of non-volatile memory media 122. In certain embodiments, one or more different architectures of non-volatile memory media 122 may use the same, common, predefined encoding as depicted in FIG. 12 (e.g., Gray code; L0=111, L1=011, L2=001, L3=101, L4=100, L5=000, L6=010, L7=110; or the like). For example, instead of progressing from two abodes (SLC mode), to four abodes (MLC mode), to eight abodes (TLC mode) in sequential stages as depicted, other architectures may use a first stage with two abodes and progress to second and third stages each with eight abodes, simply narrowing or refining a size or width of the abodes in the third stage. Other architectures may include eight abodes in each of the three stages, or the like.

Figure 11:
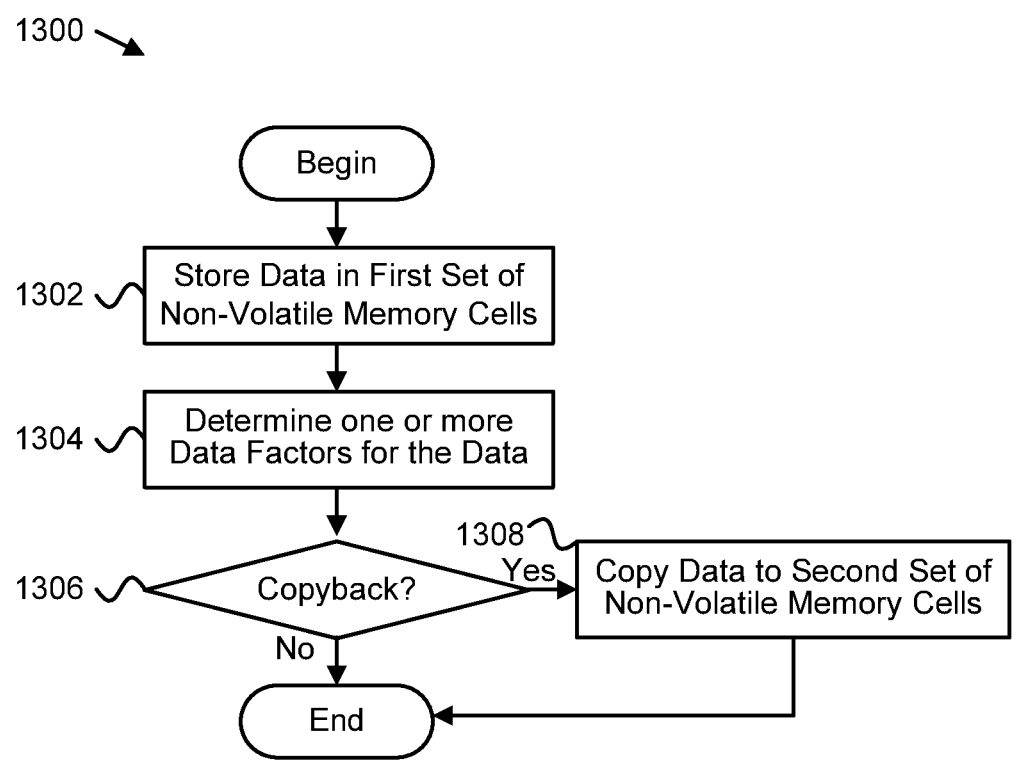
FIG. 11 is a schematic flow chart diagram illustrating one embodiment of a method for on die buffered (ODB) non-volatile memory management.

FIG. 11 depicts one embodiment of a method 1300 for on die buffered (ODB) non-volatile memory management. The method 1300 begins and the buffer module 302 stores 1302 data in a first set of non-volatile memory cells. The data factor module 322 determines 1304 one or more data factors or attributes associated with the data. The copyback module 306 determines 1306 whether to internally copy or move the data to a second set of non-volatile memory cells based on the one or more data factors or attributes. The second set of non-volatile memory cells, in one embodiment, is configured to store more bits per cell than the first set of non-volatile memory cells. If the copyback module 306 determines 1306 to move or copyback the data, the copyback module 306 copies 1308 the data to the second set of non-volatile memory cells. The method 1300 ends.

FIG. 12 depicts a further embodiment of a method 1400 for on die buffered (ODB) non-volatile memory management. The method 1400 begins and a buffer module 302 stores 1402 data in a first set of non-volatile storage cells. A refresh module 304 determines 1404 whether to refresh the data. If the refresh module 304 determines 1404 to refresh the data, the refresh module 304 decodes 1406 the data from the first set of non-volatile storage cells and re-encodes 1406 the data for copying or moving to a second set of non-volatile storage cells based on one or more data factors or attributes associated with the data. The second set of non-volatile storage cells, in one embodiment, encodes data with more storage states per cell than the first set of non-volatile storage cells. A copyback module 306 copies 1408 the data to the second set of non-volatile storage cells and the method 1400 ends.

Figure 13:
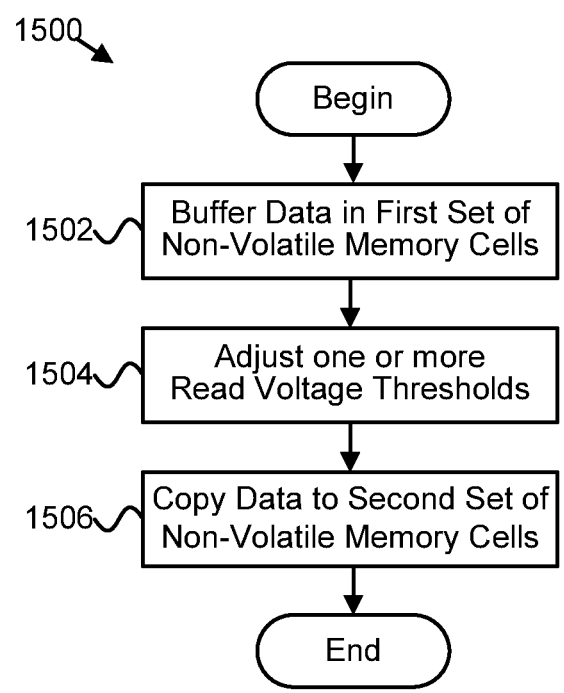
FIG. 13 is a schematic flow chart diagram illustrating a further embodiment of a method for on die buffered (ODB) non-volatile memory management.

FIG. 13 depicts another embodiment of a method 1500 for on die buffered (ODB) non-volatile memory management. The method 1500 begins and a buffer module 302 buffers 1502 data in a first set of non-volatile memory cells. A read voltage module 312 adjusts 1504 one or more read voltage thresholds for the first set of non-volatile memory cells based on one or more storage media characteristics for the first set of non-volatile memory cells. A copyback module 306 copies 1506 the data from the first set of non-volatile memory cells to a second set of non-volatile memory cells using the adjusted 1504 one or more read voltage thresholds. The second set of non-volatile memory cells, in one embodiment, is configured to store more bits per cell than the first set of non-volatile memory cells.

Additional Description:

In one embodiment, the management module 150 optimizes the ODB programming steps in TLC NAND. In one embodiment, the management module 150 may optimally determine whether a page being moved from SLC to TLC in a NAND device should be error-check/corrected before being placed on the TLC page. The process of decoding the code word, correcting any errors and then re-encoding the code word may be called "encoding refresh." Multiple factors can be used to make this determination including current age (P/E) of the NAND, scanner feedback, etc. In certain embodiments, it may be better if the factor is either readily available or quick and easy to measure/detect.

ODB is a programming model for TLC. This model may buffer some of the data on the NAND chips in an SLC block until the data is later compacted into the TLC block. The controller (and the host) may be responsible for managing the data that moves between the SLC block and the TLC block.

The process of compacting pages from SLC blocks into TLC blocks may comprise a "copyback" operation. The NAND maker may recommend that blocks read from SLC blocks during copy back be decoded and re-encoded by an error protection mechanism (ECC), "encoding refresh," to ensure high data reliability. The management module 150 may have multiple variations that range from not doing encoding refresh to doing selective encoding refresh to doing all encoding refresh.

"Copy back" may not complete if the destination TLC EB is not usable (marked as bad/worn out). Furthermore, when the management module 150 is used on a flash array, the array may be organized into rows of n (n=29=28+1 parity) die wide. The row may be managed using adaptive flashback—this means that as EBs fail in a row, rather than re-mapping EBs to retain the same row width, the row size may be reduced and a shorter row used. Consequently, in one embodiment, in order for copy back to be used between two rows of the array, the number of usable EBs in each row may be at least the same. (in other words the destination row (TLC row) may be as wide as, or wider than, the source row (SLC row)).

In certain embodiments, encoding refresh and/or garbage collection may be appropriate if the destination TLC EB for a given column of the array is not usable (worn out). "Copy back" is an operation that may be on the package level for the NAND chip. If the destination TLC EB for a given column of the array is not usable, then the copy back operation, in certain embodiments, may not be performed because for a given package/die there may be no destination TLC EB available. In certain embodiments, the controller may be alerted to the fact that the destination TLC EB for a given column of the array is not usable and re-map the destination TLC EB for the copy back operation to another TLC EB that is available. (The alternative TLC EB used may be chosen from a pool of reserved TLC EBs set aside for this purpose). In another embodiment, if the destination TLC EB for a given column of the array is not usable, then the whole LEB may be read out of the NAND into the controller and re-packetized before being stored on the destination TLC EB.

An array of cells may be made up of rows of LEBs which map to the same EB address on each pad across a row of pads. This mapping may make copy back operations difficult if the destination TLC EB is unusable. To resolve this, the mapping of PEBs to LEBs in the row of the array may be maintained by an arbitrary assignment that is not based on physical position or address in the row of the array. If an LEB 0 is mapped to EB 1, EB m, EB n, EB o, etc., then the copy back operation may be performed by re-mapping of PEBs in other rows of the array.

In one embodiment, the management module 150 may send data of an SLC page to one of the TLC buffers and stream out the data for "encoding refresh". Logic in the controller/read pipeline may determine whether or not to do an encoding refresh. The determination may be made based on RBER (or # of errors) and/or other factors. If encoding refresh is advised then the page may be decoded and re-encoded in a new code word within the controller. The data of the page, in one embodiment, may stay in the controller and not move to the main memory over PCIe interface during encoding refresh. The management module 150, in certain embodiments, may quickly determine whether or not to do the encoding refresh.

In another embodiment, the management module 150 may characterize the NAND such that the management module 150 has a model that predicts when an encoding refresh may be beneficial.

In another embodiment, the management module 150 comprises a scanner configured to mark or otherwise note pages that should and should not receive an encoding refresh when moved in a copyback operation. In either of these embodiments, the flagging or marking of the page may enable the page to be sent directly to the controller for encoding refresh or remain in the NAND die for copyback rather than sending the data down the long path.

In certain embodiments, the NAND interface may have sufficiently high throughput for refresh operations.

Another operation that the management module 150 may perform is "compression"—if data of a block in SLC is being moved to TLC—take this chance to garbage collect the block.

In certain embodiment, TLC NAND may be more lossy than SLC/MLC and therefore data stored in SLC NAND may be error checked and re-encoded to maintain a desired level of data reliability. When an SLC NAND page is being read out of SLC NAND to be moved to TLC NAND as part of an ODB copyback operation, in one embodiment, the management module 150 may selectively decide which SLC NAND pages to do encoding refresh. The management module 150, in certain embodiments, may copyback all or substantially all SLC NAND pages and later do encoding refresh on a subset based on some criteria. The criteria may be computed based on a scan, NAND characterization (models), Tprog for the copyback, use or wear measurement, errors reported during copyback, or the like.

In certain embodiments, the management module 150 may gather metadata to make a decision on whether or not to perform a refresh in a way that satisfies one or more performance metrics. In one embodiment, the management module 150 may read just a few pages and compute the RBER for them. The management module 150, in a further embodiment, may not gather any data but may leverage data maintained for other purposes such as a program/erase count, RBER, UBER, retention time, or the like. In another embodiment, the management module 150 may not gather any data and may trigger the decision based on feedback from the NAND devices—(e.g. longer Tprog or copyback, error or warning messages from NAND chip, or the like).

The management module 150, in certain embodiments, may select one of a plurality of destinations for refreshed data, in response to a decision to do an encoding refresh, such as the original TLC NAND, alternate TLC NAND, Log Append point, or the like. In one embodiment, if the destination TLC page is bad, too worn, or otherwise unusable (busy doing another operation), the management module 150 may redirect the SLC page to the Log Append point. If the SLC page is in low demand (few reads/writes) and there is low performance pressure, in one embodiment, the management module 150 may remove invalid (e.g. garbage) blocks from the SLC page and redirect the SLC page to the Log Append point.

The management module 150, in one embodiment, may selectively perform copyback operations between SLC EBs and TLC EBs such that not all data is moved to the TLC EBs. Leaving some of the data in the SLC EBs may enable the device to achieve certain QOS requirements. The management module 150, in certain embodiments, selectively decides whether to perform copyback operations based on factors that may be considered in making this decision (e.g., write frequency, QOS, or the like).

In certain embodiments, reads may take longer on TLC than on SLC or MLC. Due in part to reliance of the NAND part on wordline disturbs, NAND makers may suggest that WLn not be read until WLn+1 is programmed. The management module 150, in one embodiment, reads WLn before WLn+1 is programmed if any errors can be accommodated, corrected, or the like. Being able to read WLn before WLn+1, in certain embodiments, may increase performance by making the data accessible sooner.

The management module 150, in one embodiment, when doing a copyback operation, may avoid a data refresh overhead by using a read voltage threshold management (VTM) model for SLC erase blocks (EBs). In certain embodiments, the management module 150 may apply a VTM model to the source SLC EBs for the copyback operation, and the SLC EB data can go to TLC EB without decoding, correction, and re-encoding. The data may be read, with the VTM settings, from the cells to the NAND buffer and then moved to the TLC EB. The VTM model may direct or indicate a few SLC EBs for refresh. The VTM model, in one embodiment, is applied just during the copyback operation (e.g. the SLC EB read). Normal reads, in one embodiment, do not use the SLC VTM model. Additionally, in certain embodiments, the VTM model may just be applied to SLC EBs having a certain wear characteristic.

The management module 150, in one embodiment, uses a VTM table with the SLC EB to facilitate copyback. In certain embodiments, SLC nand may be assumed to be robust enough to operate without VTM. However, in certain embodiments, instead of refreshing SLC EBs, the management module 150 may apply a VTM adjustment at the time the SLC EBs are read so that a refresh is avoided. The data may stay in the package and move from the cells to the internal page buffers and then to the TLC destination EB. In one embodiment, SLC EBs still may be marked by a scanner for refresh if the scanner determines a refresh should be performed. The management module 150 may detect marked SLC EBs during the copyback operation. In one embodiment, a VTM adjustment may be used on SLC EBs just for copyback operations.

In one embodiment, the management module 150 may optimize use of the ODB programming steps in TLC NAND. The management module 150, in certain embodiments, may optimally allocate SLC blocks in relation to TLC blocks to maximize the life of the NAND. The management module 150, in one embodiment, may pre-allocate EBs as SLC and others as TLC and keep the allocation for the life of the EB. In a further embodiment, the management module 150 may change the mode allocation throughout a life of the EB.

ODB is a programming model for TLC. This model, in certain embodiments, may buffer some of the data on the NAND chips in an SLC block until the data may later be compacted into the TLC block. The controller (e.g., the management module 150) may be responsible for managing the data that moves between the SLC block and the TLC block, and may introduce certain optimizations.

The controller, in one embodiment, may define which blocks are SLC and which are TLC. The NAND, in certain embodiments, may impose certain restrictions on when a block (EB) may be in SLC or TLC mode. In one embodiment, after an erase operation, a block may be placed in SLC, MLC, and/or TLC mode. In certain embodiments, for some NAND makes, or the like, once the mode is changed it stays changed until changed again using a SET FEATURE command or the like. In other embodiments, for other NAND makes, or the like, the mode changes just for the current operation and then reverts back to a default mode.

In one embodiment, the management module 150 may engineer the SLC/TLC block allocations so that the SLC blocks and the TLC blocks all wear out at or around substantially the same milestone. Under a pre-allocation scenario, in one embodiment, the management module may determine an optimal ratio. In one embodiment, a manufacturer, for example, may set a ratio for SLC/TLC of 1.2% of overall capacity being SLC and the rest TLC. By default, in one embodiment, a manufacturer may keep the pages in their SLC/TLC modes for the life of the device.

In one embodiment, the management module 150 dynamically switches a block mode for one or more erase blocks. The management module 150, in certain embodiments, may fairly and/or evenly spread TLC and SLC wear. The management module 150 may determine when to switch from SLC to TLC to SLC or the like.

In certain embodiments, the management module 150 may keep RBER statistics for each EB as measured when last scanned in a TLC mode or the like and may assign the lossiest EBs to SLC buffer duty. TLC blocks, in one embodiment, may be used until their reliability falls below a threshold, or the like, then they may be demoted to SLC blocks. The TLC blocks may be demoted to MLC blocks first and then to SLC, may go directly to SLC, or the like. The management module 150, in one embodiment, may monitor a reliability when a scanner reviews the EB, another time a read operation is done on that EB, or the like.

In another embodiment, the management module 150 may monitor the health of the EB by checking the tERASE for the EB. tERASE, in certain embodiments, goes up as the EB wears out. tERASE, in one embodiment, may be easy to monitor and detect at the time of grooming or garbage collection.

NAND parts, in certain embodiments, may have certain EBs setup as SLC and other EBs setup as TLC, with the percentage of SLC to TLC being set by the manufacturer or the like. These settings may be fixed for the life of the NAND. Such fixed and rigid allocations and use, in one embodiment, may be generalized by the manufacturer for all customers and may not be the best solution for certain workloads.

The management module 150, in certain embodiments, may have access to dynamically change the configurations of EBs from TLC to SLC or SLC to TLC, or the like, changing the SLC/TLC allocations to maximize the life and use of the NAND. With access to the knobs, the management module 150 may change the TLC EBs to MLC or SLC EBs based on reliability and/or performance metrics. Based on workload characteristics, such as QOS, in one embodiment, the management module 150 may allocate more EBs to SLC when there are more high value blocks in the workload and may cause copyback to not be done, aborted if in process, or the like. Based on user configuration settings, the management module 150, in a further embodiment, may allocate more EBs to TLC (e.g. desires higher density) when proper user settings are set or the like.

The management module 150, in one embodiment, optimally maps LBAs for data blocks to one of two potential physical locations for the data on NAND. TLC NAND that does On Die Buffering programming to transition data from SLC to TLC EB, in certain embodiments, may have the same data in two different locations for a limited time period. The management module 150, in one embodiment, may determine where the LBA of the forward map (e.g., logical-to-physical mapping structure) should point to with its LBAs and how that destination address is managed. The management module 150 may use an engineered process for maintaining the destination physical address, the order of operations for updating the forward map, and/or recovery steps should a power-cut event occur.

ODB is a programming model for TLC. This model may buffer some of the data on the NAND chips in an SLC block until the data may later be compacted into the TLC block. The controller (e.g., the management module 150) may be responsible for managing data that moves between the SLC block and the TLC block and may introduce certain optimizations.

The controller/driver (e.g., the management module 150) may maintain a forward map (e.g., a logical-to-physical mapping structure) between LBAs and destination PAs on the NAND. In a TLC device, where ODB is being used, the physical address may change as data moves between SLC and TLC blocks using the copy back operation. The management module 150 may manage the physical address change. In certain embodiments, the management module 150 may handle power-cut scenarios.

A copyback operation, in one embodiment, involves the host. The host may determine the destination physical address, which may be a TLC page on the NAND. During copyback, in certain embodiments, multiple copies of a page may exist. In one embodiment, the physical address for the forward map may be set initially as the physical address of the SLC page. While copy back is in process, the physical address in the forward map may stay the SLC page until the management module 150 confirms that the data is readable from the TLC page. This may be indicated, in various embodiments, by a completion indicator from the NAND, a test read of the TLC page, or the like.

In one embodiment, the management module 150 may update the LRBTree (e.g., a logical-to-physical mapping structure) just after TLC pages can be read and before an SLC Erase is scheduled. In a further embodiment, management module 150 may update the LRBTree just after the entire TLC erase block is successfully programmed, and before the source erase block is erased. The management module 150, in certain embodiments, may prevent or eliminate partially filled erase blocks by not erasing a source erase block until the target erase block is completely filled (the empty and fill rates may be skewed due to invalidation.)

Because copyback, in certain embodiments, may be an extended process, the management module 150 may optimize access to data in pages involved in a copyback operation. For example, in one embodiment, if data on a page is being accessed with high frequency, the copyback operation may be aborted and leave the data in the SLC, which may provide faster reads, leveraging a cache eviction policy or the like. In another embodiment, if data on a page is being accessed with high frequency, the copyback operation may continue but may be modified such that a copy of the data stays in the SLC, which may provide faster reads or the like, and the data may be read from the SLC until the high frequency of accesses declines. Additionally, in one embodiment, data on an SLC PEB may be tagged with a particular quality of service (QoS) marker. If the SLC PEB data is of high QoS, in certain embodiments, the data may either a) not be moved to TLC, b) be moved to TLC but also be in the SLC PEB to provide higher read performance or the like, or c) other techniques.

In one embodiment, the management module 150 may not pace copyback operations at the wordline level when considering when to mark SLC packets as invalid. Rather, in certain embodiments, the management module 150 may not mark SLC packets as invalid until after the entire erase block has been copied to TLC. The management module 150, in a further embodiment, may not mark SLC packets as invalid until just before the management module 150 erases the SLC EB. The management module 150, in one embodiment, may hold two different packet locations to manage that overlap that may benefit Read Latency performance.

As described above, in certain embodiments, "copy back" may not complete if the destination TLC erase block is not usable (e.g., marked as bad/worn out). In one embodiment, the management module 150 may use a flash array, organized into rows of n (n=29=28+1 parity) die wide or the like. The row may be managed using adaptive flashback or the like. For example, in certain embodiments, as erase blocks fail in a row, rather than re-mapping erase blocks to retain the same row width, the row size may be reduced and a shorter row used. Consequently, in one embodiment, in order for copy back to be used between two rows of the array, the number of usable EBs in each row may be at least the same. (In other words, in certain embodiments, the destination row (TLC row) may be as wide as, or wider than, the source row (SLC row)).

The process of decoding the code word, correcting any errors and then re-encoding the code word may be called "encoding refresh." In certain embodiments, encoding refresh and/or garbage collection may be appropriate if the destination TLC EB for a given column of the array is not usable (worn out). "Copy back" is an operation that may be on the package level for the NAND chip. If the destination TLC EB for a given column of the array is not usable, in one embodiment, the copy back operation cannot be performed because for a given package/die there may be no destination TLC EB available.

In certain embodiments, the controller (e.g., the management module 150) may be alerted to the fact that the destination TLC EB for a given column of the array is not usable and re-map the destination TLC EB for the copy back operation to another TLC EB that is available. (The alternative TLC EB used, in one embodiment, may be chosen from a pool of reserved TLC EBs set aside for this purpose or the like). In another embodiment, if the destination TLC EB for a given column of the array is not usable, then the whole LEB may be read out of the NAND into the controller and re-packetized, and potentially placed in a new location in the log, before being stored on the destination TLC EB.

In one embodiment, TLC with copyback programming may present a situation in which data on a NAND page exists in multiple locations for a period of time. The source SLC pages, in certain embodiments, may come from the same EB, different EBs, or the like. For a copyback procedure, in one embodiment, the management module 150 may use three pages from one or more different EBs, from the same EB, or the like. The management module 150, in certain embodiments, may determine when copyback should be initiated and when copyback should be deferred.

In one embodiment, if data blocks are marked with high QOS, the management module 150 may defer copyback and leave the data in SLC. In a further embodiment, if data blocks have high access rate (read and/or write), the management module 150 may defer copyback and leave the data in SLC (e.g., using SLC as a cache or the like). If there is high capacity pressure and data blocks are not tagged for special treatment or the like, in certain embodiments, copyback may be initiated.

The management module 150, in one embodiment, may determine when the mapping between LBA and physical address (PA) is updated. In certain embodiments, the management module 150 may update the forward map after the data in the SLC EB is verified as stored. Being verified, in one embodiment, may mean the data is read (e.g., a system initiated read, a deferred read done by the scanner, or the like) back and confirmed accurate. The management module 150, in a further embodiment, may update the forward map after the data in the SLC EB is stored in TLC, without verification or the like. In another embodiment, the management module 150 may update the forward map with a before PA (primary) and an after PA (secondary) before the copyback operation and remove the before PA after the data is in the TLC EB, or the like. The primary PA, in one embodiment, may be the SLC because it may have faster reads and writes, or the like.

The management module 150, in certain embodiments, may determine when the old SLC page may be recovered. In one embodiment, the management module 150 may recover the SLC page after the data in the SLC EB is verified as stored, (e.g., read back and confirmed accurate). In certain embodiments, the management module 150 may verify data in response to a user initiated read. The management module 150, in one embodiment, may recover the SLC page after an access rate for the data in the SLC EB is below a threshold, caching data using an SLC EB or the like. The management module 150, in another embodiment, may recover the SLC page in response to storage capacity pressure.

The management module 150, in certain embodiments, may apply a preferred order of operations to mitigate issues when a power cut interrupts TLC copyback. In one embodiment, once data is confirmed safely stored on the TLC page, the data may be power cut safe. The management module 150, in a further embodiment, may a) initiate copyback, b) confirm copyback success, c) update forward map with new address, and/or d) use another technique. In a certain embodiment, the management module 150 may defer updating of the forward map and recovery of the SLC page until there is storage capacity pressure or the like. For performance reasons, in one embodiment, the SLC page may be used to service reads.

The management module 150, in certain embodiments, may optimize use of TLC NAND during a power-cut event. In a further embodiment, the management module 150 may optimally map LBAs for data blocks to one of two potential physical locations for the data on NAND in the event of a power cut. TLC NAND that does On Die Buffering programming to transition data from SLC to TLC EB, in certain embodiments, may have the same data in two types of blocks for a limited time period. In the event of a power cut, there may be a chance that a TLC physical erase block (PEB) has not yet been completely filled (e.g., that each page of the PEB has not been programmed) which may be referred to as an incomplete TLC PEB. The management module 150 may be configured to handle this incomplete TLC PEB.

ODB is a programming model for TLC. This model may buffer some of the data on the NAND chips in an SLC block until the data is later compacted into a TLC block, or the like. The controller (and host) may be responsible for managing the data that moves between the SLC block and the TLC block. The controller/driver, in certain embodiments, may maintain a forward map between LBAs and destination PAs on the NAND. In a TLC device, where ODB is being used, the PA may change as data moves between SLC and TLC blocks using the copy back operation.

The management module 150, in one embodiment, may manage this physical address change, may manage partially programmed TLC EBs, or the like. The copyback operation, in certain embodiments, involves the host. The host, in one embodiment, determines the destination PA which may be a TLC page on the NAND.

During copyback, multiple copies of a page may exist. The PA for the forward map, in one embodiment, may be set initially as the PA of the SLC page. While copy back is in process, in certain embodiments, the PA in the forward map may remain the PA for the SLC page until the management module 150 can confirm that the data is readable from the TLC page. This may be indicated by a completion indicator from the NAND, a test read of the TLC page, or the like.

To avoid potential problems that a power cut may cause while a TLC PEB is being programmed by copyback, in one embodiment, the management module 150 may allow the PA for the forward map to remain the PA of the SLC page until the management module 150 can confirm that the data is readable from the TLC page, or the like. If power cut occurs during programming of a page of the TLC PEB, in one embodiment, the management module 150 may instead use the data in the SLC PEBs (e.g., three of them). On recovery from power cut, in certain embodiments, the management module 150 may groom this TLC EB.

In one embodiment, the management module 150 may not save valid data from the TLC EB during grooming, since the source SLC EB(s) are not yet groomed. The management module 150 may satisfy reads from the source SLC EB(s). In certain embodiments, the management module 150 may perform an erase operation on the TLC EB once the power is back on. In a further embodiment, the management module 150 may use the partially programmed TLC EB right away as an active TLC EB, or the like. The LRBTree (e.g., logical-to-physical mapping structure), in certain embodiments, is not updated in response to grooming the TLC EB.

TLC with copyback programming, in one embodiment, may have a potential for partially programmed TLC EBs at the time of a powercut, or the like. The management module 150, in certain embodiments, may interrupt/abort copyback operations and consider the TLC EB partially filled and holding only invalid/garbage data. Instead of data in TLC EB, in one embodiment, the management module 150 may use the SLC EB data. The management module 150, in a further embodiment, may mark completed TLC EBs with an indicator, if the indicator is not present, the EB is a partial EB, and the management module 150 may consider all data on the partially programmed EB as unreliable and mark the EB for GC/Erasure, or the like. In one embodiment, the management module 150 may not update the forward map until the new data is properly stored in the TLC EB, or the like. In certain embodiments, the management module 150 may use multiple factors to make this determination including one or more of a current age (P/E) of the NAND, scanner feedback, or the like. In one embodiment, the factor may be readily available, very quick and easy to measure/detect, or the like.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   storing data in a first set of non-volatile memory cells;
   determining one or more attributes associated with the data;
   determining whether to store the data in a second set of non-volatile memory cells based on the one or more attributes associated with the data, the second set of non-volatile memory cells configured to store more bits per cell than the first set of non-volatile memory cells;
   aborting storing of the data in the second set of non-volatile memory cells in response to a power level failing to satisfy a threshold; and
   accessing the data from the first set of non-volatile memory cells after recovery from the power level failing.

2. The method of claim 1, wherein determining the one or more attributes associated with the data comprises reading at least a subset of the data from the first set of non-volatile memory cells and factoring in results of the reading of the at least a subset to determine the one or more attributes.

3. The method of claim 1, wherein the one or more attributes associated with the data comprise one or more of a write frequency for the data, a read frequency for the data, a quality-of-service level for the data, an age for the data, an error rate for the data, a capacity threshold being satisfied for the first set of non-volatile memory cells, and a program/erase cycle count for the first set of non-volatile memory cells.

4. The method of claim 1, wherein the first set of non-volatile memory cells comprises single level cells and the second set of non-volatile memory cells comprises triple level cells.

5. The method of claim 1, wherein at least some of the data is stored in the second set of non-volatile memory cells from the first set internally within an integrated circuit die without the at least some of the data leaving a package of the integrated circuit die.

6. The method of claim 1, further comprising storing the data in the second set of non-volatile memory cells using an internal data transfer command of a non-volatile memory element comprising the first and second sets of non-volatile memory cells.

7. The method of claim 1, further comprising adjusting one or more read voltage thresholds for the first set of non-volatile memory cells based on one or more storage media characteristics for the first set of non-volatile memory cells and using the adjusted one or more read voltage thresholds to read the data from the first set of non-volatile memory cells for storing in the second set of non-volatile memory cells.

8. The method of claim 1, further comprising determining, based on the one or more attributes, whether to perform an error-correcting code (ECC) decode for the data from the first set of non-volatile memory cells and an ECC re-encode for the data for storing the data in the second set of non-volatile memory cells.

9. The method of claim 1, further comprising maintaining a first logical-to-physical mapping for a location of the data in the first set of non-volatile memory cells and maintaining a second logical-to-physical mapping for a location of the data in the second set of non-volatile memory cells.

10. The method of claim 1, further comprising verifying data integrity of the data in the second set of non-volatile memory cells in response to a trigger.

11. The method of claim 10, wherein the trigger comprises at least one of verifying storage of the data in the second set of non-volatile memory cells, verifying data integrity of the data in the second set of non-volatile memory cells, a read request for the data, a background scan of the second set of non-volatile memory cells, a storage capacity threshold being satisfied, and a storage capacity recovery event for the first set of non-volatile memory cells.

12. The method of claim 1, further comprising recovering storage capacity of the first set of non-volatile memory cells in response to an access rate for the data failing to satisfy an access threshold.

13. The method of claim 1, further comprising retaining the data stored in the first set of non-volatile memory cells after storing the data in the second set of non-volatile memory cells to service one or more read requests for the data using the first set of non-volatile memory cells based on a quality-of-service level for the data.

14. The method of claim 1, further comprising erasing the data from the first set of non-volatile memory cells and recovering storage capacity of the first set of non-volatile memory cells in response to a quality-of-service level for the data failing to satisfy a threshold.

15. The method of claim 1, further comprising recovering storage capacity of the first set of non-volatile memory cells in response to a storage capacity threshold being satisfied.

16. The method of claim 1, further comprising erasing the second set of non-volatile memory cells after recovery from the power level failing.

17. The method of claim 1, further comprising marking the second set of non-volatile memory cells as filled in response to storing the data in the second set of non-volatile memory cells and erasing one or more sets of non-volatile memory cells not marked as filled after recovery from a power level failing to satisfy a threshold.

18. The method of claim 1, further comprising aborting an in-process copyback procedure for the data in response to determining not to store the data in the second set of non-volatile memory cells based on the one or more attributes.

19. An apparatus comprising:
a buffer module configured to store data in a first set of non-volatile storage cells;
a copyback module configured to determine whether to store the data in a second set of non-volatile storage cells based on one or more data factors, the second set of non-volatile storage cells representing data using more storage states per cell than the first set of non-volatile storage cells; and
a power-cut module configured to abort the copyback module storing the data in the second set of non-volatile storage cells in response to a power level failing to satisfy a threshold, the abort causing the data to be accessed from the first set of non-volatile storage cells after recovery from the power level failing.

20. The apparatus of claim 19, further comprising a refresh module configured to determine whether to perform an error-correcting code (ECC) refresh for the data for storing the data in the second set of non-volatile storage cells based on the one or more data factors, the ECC refresh comprising the refresh module decoding one or more ECC code words of the data using an error-correcting code decoder and re-encoding the data using an error-correcting code encoder for storing the re-encoded data in the second set of non-volatile storage cells.

21. The apparatus of claim 19, further comprising an abort module configured to abort an in-process copyback procedure for the data in response to the copyback module determining not to store the data in the second set of non-volatile storage cells based on the one or more data factors.

22. The apparatus of claim 19, further comprising a read module configured to service read requests for the data from the first set of non-volatile storage cells prior to the data being erased from the first set of non-volatile storage cells and to service read requests from the second set of non-volatile storage cells after the data is erased from the first set of non-volatile storage cells.

23. The apparatus of claim 19, further comprising a read voltage module configured to determine one or more read voltage thresholds for the first set of non-volatile storage cells proactively based on one or more storage media characteristics for the first set of non-volatile storage cells, the copyback module configured to use the one or more read voltage thresholds to read the data from the first set of non-volatile storage cells for storing in the second set of non-volatile storage cells.

24. The apparatus of claim 19, wherein the power-cut module is configured to mark the second set of non-volatile storage cells as filled in response to the copyback module storing the data to the second set of non-volatile storage cells and to erase one or more sets of non-volatile storage cells not marked as filled after recovery from a power level failing to satisfy a threshold.

25. The apparatus of claim 19, further comprising a data factor module configured to maintain metadata indicating the one or more data factors over time based on at least one of a storage request for the data and a background scan of the data.

26. The apparatus of claim 19, wherein the first set of non-volatile storage cells and the second set of non-volatile storage cells are located in a same plane of an integrated circuit die.

27. A system comprising:
a non-volatile memory element comprising a set of single level cell (SLC) non-volatile memory cells and a set of triple level cell (TLC) non-volatile memory cells; and
a controller that:
selectively determines to copy data from the set of SLC non-volatile memory cells to the set of TLC non-volatile memory cells;
adjusts one or more read voltage thresholds for the set of SLC non-volatile memory cells based on one or more storage media characteristics for the set of SLC non-volatile memory cells for copying the data from the set of SLC non-volatile memory cells to the set of TLC non-volatile memory cells;
marks the set of TLC non-volatile storage cells as filled in response to storing the data to the set of TLC non-volatile storage cells; and
erases one or more sets of TLC non-volatile storage cells not marked as filled after recovery from a power level failing to satisfy a threshold.

28. The system of claim 27, wherein the controller determines the one or more read voltage thresholds for the set of SLC non-volatile memory cells proactively in an open-loop manner based on the one or more storage media characteristics for the set of SLC non-volatile memory cells.

29. The system of claim 27, wherein the controller services read requests for the data from the set of SLC non-volatile memory cells without using the adjusted one or more read voltage thresholds.

* * * * *